United States Patent [19]
Murakami

[11] Patent Number: 5,378,911
[45] Date of Patent: Jan. 3, 1995

[54] STRUCTURE OF SEMICONDUCTOR DEVICE

[75] Inventor: Yoshinori Murakami, Tokyo, Japan

[73] Assignee: Nissan Motor Co., Ltd., Yokohama, Japan

[21] Appl. No.: 186,847

[22] Filed: Jan. 27, 1994

[30] Foreign Application Priority Data

Feb. 23, 1993 [JP] Japan .................. 5-033419

[51] Int. Cl.$^6$ ............ H01L 29/10; H01L 29/78
[52] U.S. Cl. .................. 257/334; 257/405; 257/407
[58] Field of Search ......... 257/405, 407, 329, 330, 257/331, 332, 333, 334

[56] References Cited

U.S. PATENT DOCUMENTS

| | | | |
|---|---|---|---|
| 3,638,078 | 1/1972 | Wallmark | 317/234 |
| 4,835,586 | 5/1989 | Cogan et al. | 357/23.14 |
| 5,177,572 | 1/1993 | Marakami | 257/260 |

FOREIGN PATENT DOCUMENTS 57-172765 10/1982 Japan .................. 257/334

OTHER PUBLICATIONS

MacIver, Bernard A. et al., "Characteristics of Trench j-MOS Power Transistors", *IEEE Electron Device Letters*, vol. 10, No. 8 (Aug. 1989).

Chang, H.-R. et al., "500-V n-Channel Insulated-Gate Bipolar Transistor with a Trench Gate Structure", *IEEE Transactions on Electron Devices*, vol. 36, No. 9 (Sep. 1989).

Primary Examiner—Jerome Jackson
Assistant Examiner—Donald L. Monin, Jr.
Attorney, Agent, or Firm—Foley & Lardner

[57] ABSTRACT

A structure of a semiconductor device according to the present invention has a normally-off characteristic, a well controlability, a very low on-resistance, a capability for a high breakdown voltage, and is free from parasitic devices. For example, said semiconductor device has a plurality of bar-shaped trenches dug on the surface of an n type semiconductor substrate, which are arranged in stripe, and each of which cross sectional shape is a "U"-shape. At least one n+ type source region on the surface and it is sandwiched by the trenches. In the respective trenches, insulated electrodes whose potential is fixed to that of the source region, and whose conductive material is made of such that has a work function to generate a depletion region in the drain region around them are disposed. The depletion region functions as a barrier to interrupt between the source region and the drain region electrically. P type injector region is also disposed on the surface of the drain region, and it touches the every surface of the potential-fixed insulated electrodes at every edge of the bar-shapes, and arbitrary potential can be applied to it from an external. The potential of the injector region controls the potential of the surface of the insulated electrodes, which effects the condition of the depletion region and that effects the main current value.

22 Claims, 22 Drawing Sheets

STRUCTURE OF SEMICONDUCTOR DEVICE

BACKGROUND OF THE INVENTION (1) Field of the Invention

The present invention relates generally to a structure of a semiconductor device and, particularly, related to a structure of a bipolar type, normally off, and vertical type power semiconductor device.

(2) Description of the Background Art

Various types of bipolar mode, semiconductor device structures have been proposed. In the following, three types of such semiconductors devices will be introduced herein as the background arts.

First Reference

The device structure of a first reference is described in the paper titled "Characteristics of Trench j-MOS Power Transistors" by Bernard A. MacIVER. STEPHEN J. VALERI, KAILASH C. JAIN, JAMES C. ERSKINE, REBECCA ROSSEN, IEEE ELECTRON DEVICE LETTERS, VOL. 10, No. 8, pages 380 to 382, published on August, 1989.

FIGS. 1 through 3 show the structure of the device of the first reference device quoted from the paper introduced.

FIG. 1 is a top view of the device. FIG. 2 and FIG. 3 are cross sectional views cut away along the lines A-A' and B-B' in FIG. 1, respectively, and viewed along the arrows accompanied with these lines.

According to the paper introduced above, the whole semiconductor material is silicon. An n+ type substrate 81 is an n+ type drain region. And, a channel region 82 made of the n type region is formed on a main surface of the substrate 81. In addition, n+ type source regions 83 are formed on the surface of the n type channel region 82. Furthermore, as shown in FIGS. 1 through 3, there are trenches dug from the surface of the device that are arranged in stripes. Side surfaces of these trenches are approximately vertical, and their bottom surfaces reach the substrate 81.

Each of insulating films 84 is formed on an internal surface of the respective trenches, and conductive polycrystalline silicons 85 filling each interior of the trench constitute gate electrodes. An interlayer 86 covers an upper surface of the conductive polycrystalline silicon 85. A unit constituted by the items 84, 85, and 86 will be referred to as an "insulated gate 87" of this device hereinafter, as shown in FIG. 3. Each of the n+ type source regions 83 is sandwiched by the insulated gates 87. Also, as shown in FIGS. 1 and 2, a p type region 88 is formed on the channel region and is located adjacent to the insulated gates 87. A source electrode "S" made of a metallic layer 93 connects every source region 83. A metal electrode 95 which connects with the gate electrode 85 is referred to as the "MOS gate", and the metal electrode 98 connects with the p type region 88 is referred to as a "junction gate", hereinafter. A drain electrode "D" made of a metallic layer 91 connects with the drain region 81, and it is not described in the paper introduced above, but is added in these illustrations for better understanding. And all these contacts between the metal and the semiconductor described above form ohmic contacts.

A resistivity of the channel region 82 indicates 0.98 $\Omega$-cm which corresponds to an impurity concentration of about $5 \times 10^{15}$ cm$^{-3}$. A channel length L shown in FIG. 3 is 6 $\mu$m, a channel thickness a indicates 3 $\mu$m, and a thickness b in each insulated gate itself 87 is 2 $\mu$m.

The Operation of First Reference Device

Generally, a positive potential is applied to the drain electrode 91 and the source electrode 93 is grounded (set to 0 V). This device is a four-terminal device that has two control electrodes, the "MOS" gate 95 and "junction" gate 98. However, the device can function as a three-terminal device to interconnect the two control electrodes.

FIG. 4 is I-V characteristic curves (drain current $I_D$ vs. drain voltage: $V_D$) of this device as the three-terminal device, which is quoted from the paper introduced above.

There are several curves when the potential of both gates $V_G$ are varied from $-16$ V to 0 V every 2 V step.

As shown in FIG. 4, it is noted that this device is, so-called, a normally-on type device. This "normally-on type device" is defined generally as the semiconductor device that can flow the main current when its control gate is grounded. And it is also noted that as the gate potential becomes negatively higher, the drain current is suppressed.

Otherwise, FIG. 5 is the I-V characteristic curves of the device operating as a four-terminal device quoted from the paper introduced above. In FIG. 5, the MOS gate potential is fixed and the junction gate potential is varied.

When applying $+16$ V to the MOS gate, the device achieves a very low on-resistance (its leftmost steep line of FIG. 5). This phenomenon causes an accumulation layer to be induced on an interface of the insulating films and the channel region functions as a current path of low resistance between the n+ type drain region 81 and n+ type source region 83. And in this case, the potential of the junction gate will hardly affect the I-V characteristics of the device.

But, when applying $-16$ V to the MOS gate, the I-V characteristic curves are largely affected by the potential of the junction gate.

In FIG. 5, there are several I-V characteristic curves varying the junction gate potential from 0 to $-3.5$ V by every 0.5 V steps.

In the following, the state of the device in this case (the MOS gate potential is $-16$ V) will be described in detail. In a case where the junction gate potential is 0 V, the linear region of the characteristic curves that is in the case of the drain potential is relatively low, the depletion region is generated adjacent to the MOS gate 87 in the channel region 82 by the negative potential of the MOS gate, and also the inversion layer of holes is generated on the surface of the insulating film in the channel region. The inversion layer serves to shield an electric field from the gate electrode 85 to the channel region, so a magnitude of spreading width of the depletion layer is held in a constant range as is different from the case of JFET.

In the case of the device described in the paper introduced above, that constant width of the depletion region can be estimated to be about 0.4 $\mu$m by using the data quoted from the paper. So that the total width of the neutral channel region remains about 2 $\mu$m. Under such situations, the main current flows the neutral channel region. And when the drain electrode gets high potential, the channel region becomes "pinch off state" as the same as the general long channel JFET, and the value of the main current saturates as shown in FIG. 5.

Next, when the potential of the junction gate is negatively increased, namely, applying a reverse bias to the junction between the p type region 88 and the channel region 84, the depletion region extended from the junction reaches the surface of the insulated gate 87. Then, a part of holes in the inversion layer on the surface of the insulating film 84 of the insulated gate 87 flows out to the p type region 88, causing the potential of the inversion layer to be varied. In other words, the potential of the interface of the insulating films synchronizes with the potential of the junction gate 98. Describing more detail, when the reverse bias of the junction increases, the potential of the interface becomes low, and the depletion region extends, and the channel region becomes narrow, and the value of the main current increases.

Features of First Reference Device

Main advantages of the first reference device which is used as the four-terminal device are listed below:

(1) Low on-resistance;

(2) Achieving a high mutual conductance (transconductance) caused by the junction gate 98;

(3) High blocking gain;

(4) High switching speed;

(5) Operating as the three-terminal semiconductor device; and so forth.

However, the above-described first reference device has the following limitations.

First, the first reference device is not suitable for such an application thereof as requiring a high breakdown voltage.

As described above, the reason of the first reference device for providing the low on-resistance structure is that each insulating gate 87 is contacted with both of the $n^+$ type source region 83 and the $n^+$ type substrate 81 so as to communicate between both $n^+$ type regions via the accumulation layer formed along the gate insulating films 84. A designed breakdown voltage of the first reference device was 60 volts. However, it is impossible for the above-described first reference device to be extensively applied to higher breakdown voltage requirements, since the insulating gates 87 described above are contacted with the $n^+$ drain region (substrate) 81.

Next, the above-described first reference device is essentially of the four-terminal device. It is essentially unavoidable for the driving method therefor to become complex. Although, as described above, the first reference device may be used as the three-terminal device with the junction gate 98 and MOS gate 95 interconnected, it cannot achieve the low on resistance, as appreciated from a comparison of FIG. 4 to FIG. 5, which is an advantage of using the first reference device described above in the three-terminal semiconductor mode.

Finally, this reference device has the normally on characteristic and, therefore, its main current naturally flows when any control signal is not applied thereto.

Second Reference

The device of second reference is described in a Japanese Patent Application First Publication No. Showa 57-172765 published on Oct. 23, 1982 titled "Electrostatic Induction Thyristor".

FIG. 6 is a cross sectional view of the second reference device quoted from the above-identified Japanese Patent Application Publication. To understand that this structure has "U"-shape trench insulated gate, FIG. 6 shows sequential three unit of which is described in the patent application introduced above.

The Structure of Second Reference

In FIG. 6, a $p^+$ type substrate 61 is an anode region of this device. An $n^-$ type base region 62 is formed on the $n^+$ anode region 61. Furthermore, the $n^+$ type cathode region 63 is formed on the $n^-$ type base region 62. There are trenches dug from the surface of $n^-$ type base region 62. The insulating film 64 formed on the inner surface of the trenches, reach the $n^-$ type base region 62. Insulating films 64 are formed on the inner surface of the trenches. And the metals 65, which are formed on the insulating films 64, and which interconnect each other, are the gate electrode. Also $p^+$ type gate regions 68 are formed on every interface between the $n^-$ type base region 62 and the insulating films 64 at the bottom of every trench. And they connect each of the gate electrode metal 65 through the contact holes at the bottom of every trench. Anode electrode 71 and cathode electrode 73 connect with the $p^+$ anode region 61 and $p^+$ cathode regions 63, respectively. These contacts between the metal and the semiconductor region are ohmic contact. The $n^-$ type region sandwiched by trench side walls is referred to as the "channel region" hereinafter. And the gate electrode 65 on the insulating film 64 functions as an "insulated gate" for the channel region.

Operation of Second Reference

Generally, a positive potential is applied to the anode electrode 71, and the cathode electrode 73 is grounded (set to 0 V). The off-state of the device is maintained by applying a negative potential to the gate electrode to generate the depletion region for the potential barrier against the conductive electrodes. That is to say, this device is the normally-on type in the same way as the first reference device.

To turn on the device, the potential of the gate electrode 65 will be set to a positive potential. Then, the depletion region in the base region is vanished, and the channels open. At the same time, the accumulation layer of electrons are generated on the surface of the insulating films in the channel region in front of the $n^+$ type cathode region, and this phenomenon accelerates the turn-on of the device. The distance between the insulated gate and the main current path should be less than the diffusion length of the carriers to obtain this effect. Also the turn-on time of this structure is faster than other general electrostatic induction thyristor which do not have this "U"-shape insulated gate structure, because the accumulation layer has a high conductivity, and the gate current can flow faster.

After the turn-on of the device is completed, the on-state of the device is maintained without any gate signal. And to turn-off the device, a negative potential is applied to the gate electrode to suck up the exceeded minority carriers in the base region, and to generate the depletion region in the channel region again.

Feature of Second Reference

The point of this device is the adding of the insulated gate synchronized with the junction gate 68 in the electrostatic induction thyristor. And it achieves the following advantages:

(1) Short turn-on time by the assistance of the accumulation layer;

(2) Short turn-off time derived from the generated depletion region being adjacent the insulating film that accelerates the pinch-off of the main current.

But, this structure has several disadvantages as follows:

First, this is a normally-on device which is the same as the first reference device.

Second, once the device turns on, it maintains on-state except applying the off-signal positively, that is one of the essential characteristics of the thyristor. The final disadvantage relates to the essential feature of this device from the aspect of fabrication. In this device structure, the contact hole for the p+ type gate region and the gate electrode must be formed at the bottom of deep trench. And for a sufficient blocking gain, the device must have the trench that depth are several μm. Even if the width of the trench is set considerably wide, and set the aspect ratio of the trench a low value, it will be very difficult to form a contact hole at the bottom of the trench by general fabrication techniques of ICs. And the difficulty will be getting worse when the device pattern is shrunk for the purpose of increasing the current carrying capability of the device.

Third Reference

The device of the third reference is IGBT having "U"-shaped insulated gate. That is, for instance, introduced in the paper titled "500-V n-channel Insulated-Gate Bipolar Transistor with a Trench Gate Structure", by H. R. CHANG, B, JAYANT, BELIGA, IEEE TRANSACTION OF ELECTRON DEVICES, VOL. 36, No. 9, September, 1989.

Structure of Third Reference

FIG. 7 is a cross sectional view of the third reference device. The p+ substrate region 40 is the collector region of the device. The n type drift layer 41 is formed on the p+ type region in layer. And the p type base region is formed on the n type region 41 also in layer. There are trenches dug from the surface of the p type region that bottoms reach the n type region. The insulating films 44 are formed on the inner surface of trenches, and every trench is filled up by the conductive polycrystalline silicon region 45 that is the gate electrode. And the interlayer insulating films 46 covers on the upper surface of the gate electrode 45. The unit consists of the insulating films 44, gate electrode 45 and the interlayer insulating film 46 will be referred to as the "insulated gate 47" of the device, hereinafter. The n+ type emitter regions 43 are formed on the p type base region that touch with the surface of the insulating film 44. Also the collector electrode 50 contacts with the collector region 40, and the emitter electrode 50 contacts with the collector region 40, and the emitter electrode 53 connects with both the emitter region 43 and the p+ contact region 48 formed on the base region. Theses contacts between a metal and semiconductor region are the ohmic contacts. The region "ch" indicated as dashed line in FIG. 7 is the channel.

Operation of Third Reference

Generally, a positive potential is applied to the collector electrode, and the emitter electrode is grounded (set to 0 V). When the gate electrode is grounded, the channel is closed and the main current does not flow. Therefore, this device is a normally-off type. To turn on the device, a predetermined positive potential is applied to the gate electrode. Then, the inversion layer by electrons are generated on the surface of the insulating films adjacent the p type base region, that means the channel open, and the electrons flow from the n+ emitter region to the n type drift region. These electrons reduce the potential barrier between the n type drift region and p+ collector region, causing the holes injection from the p+ region to the n type drift region. And the conductivity of the n type drift region, whose impurity concentration is designed to be very low level so as to withstand a predetermined high breakdown voltage, is modulated, and the main current flows at very low on-resistance. And, to turn off the device, the gate electrode is only set to 0 V, and no need to be applied any negative voltage like the first or second reference device structure. According to this operation, the channel closes, and the electron current shuts off. Therefore, the injection of the holes halts. So the whole current will stop.

Features of the Third Reference

The advantages of the third reference are as follows:
(1) Normally-off characteristic;
(2) No need of negative voltage supply for turn-off;
(3) Voltage control device, that means it has a high input impedance;
(4) No limit for pattern minimization for increasing current drive capacity.

On the other hand, there are some weak points as follows:

First, this device structure has as parasitic device. As shown in FIG. 7, the p+ collector region 40, the n type drift region 41, p type base region and the n+ type drift region 41, p type base region and the n+ emitter region constitute an p-n-p-n thyristor structure. The fact means that there is a possibility to turn on the parasitic thyristor, by very abrupt change of the collector potential or excessive supply of hole current. If it occurs, the gate electrode will lose the current control capability.

Next, the I-V characteristics has essentially a limit for the low on-resistance. Because this device has an p-n junction in the main current path, the main current cannot flow when the collector potential is under 0.7 V. This limit also exists in the device of the second reference shown in FIG. 6.

Summary of the References

As described above, the device of the first reference has a very low on-resistance, but has the limits on the increase of the current capacity of the chip, and on the increase in the breakdown voltage.

In addition, the device of the second reference has no limitation for the ability to withstand a high reverse bias, but has a problem about pattern miniaturization to increase its current capacity.

In addition, the device of the third reference is very easy to operate because of the normally-off characteristic and the voltage control feature. But it has a parastic device.

Furthermore, second and third references have limitations on low on-resistance.

SUMMARY OF THE INVENTION

It is, therefore, an object of the present invention to provide a novel device structure having a normally-off characteristic, a low on-resistance, and well controllability, and to solve the limitations described above.

The above-described object can be achieved by providing a structure of a semiconductor device according to the present invention, comprising a) a semiconductor substrate having one conductivity type, which constitutes a drain region; b) at least one trench dug from the surface of said substrate; c) at least one source region having the same conductivity type as said drain region, which is formed on a main substrate, and which is so constructed as to be provided adjacent to said trench; d) at least one potential-fixed insulated electrode whose potential is fixed to the potential of said source region, and which includes an insulating film covering the whole inner surface of the trench and a conductive material having a work function so as to form a depletion region in said drain region near said insulating film; e) a channel region which is a part of said drain region, which is adjoined below said source region, and which is so constructed as to be adjacent to said trench; and f) at least one injector region having an opposite conductivity type, formed on said drain region and which contacts with said insulating film of said potential-fixed insulated electrode, but does not contact with said source region.

The off-state of said semiconductor device is maintained by setting the potential of said injector region which is the same as that of said source region. Then, the potential barrier against the majority carriers constituted by said depletion region is formed in the channel region, so that said source region is disconnected from the neutral region of said drain region electrically. And the turning-on of said semiconductor device is realized by applying a predetermined potential to said injector region. Then the minority carriers are introduced into the interface of said insulating film, because said injector region contacts the interface. The minority carriers form an inversion layer which shields the electric field from said potential-fixed insulated electrode to said channel region to reduce the height of said potential barrier. Thus said source region connects with said drain region electrically. Furthermore, the conductivity of said drain region is increased by the minority carrier injection from said injector region to said drain region.

The BASIC IDEA of the present invention is therefore, to control the channel condition not by the potential of the insulated electrode, but by the potential of the inversion layer on the surface of the insulating film which covers the insulated electrode. The potential of the insulated electrode is fixed to that of the source region, but the insulated electrode virtually functions as a gate of the channel by the potential of the inversion layer synchronized with the potential of the injector region which touches the surface of the insulating film.

DETAILED DESCRIPTION OF THE PREFERRED EMBODIMENTS

FIGS. 1 through 7 have already been explained in the BACKGROUND OF THE INVENTION.

First Embodiment

FIGS. 8 through 11 show a first preferred embodiment of a structure of a semiconductor device according to the present invention.

Figure 8:
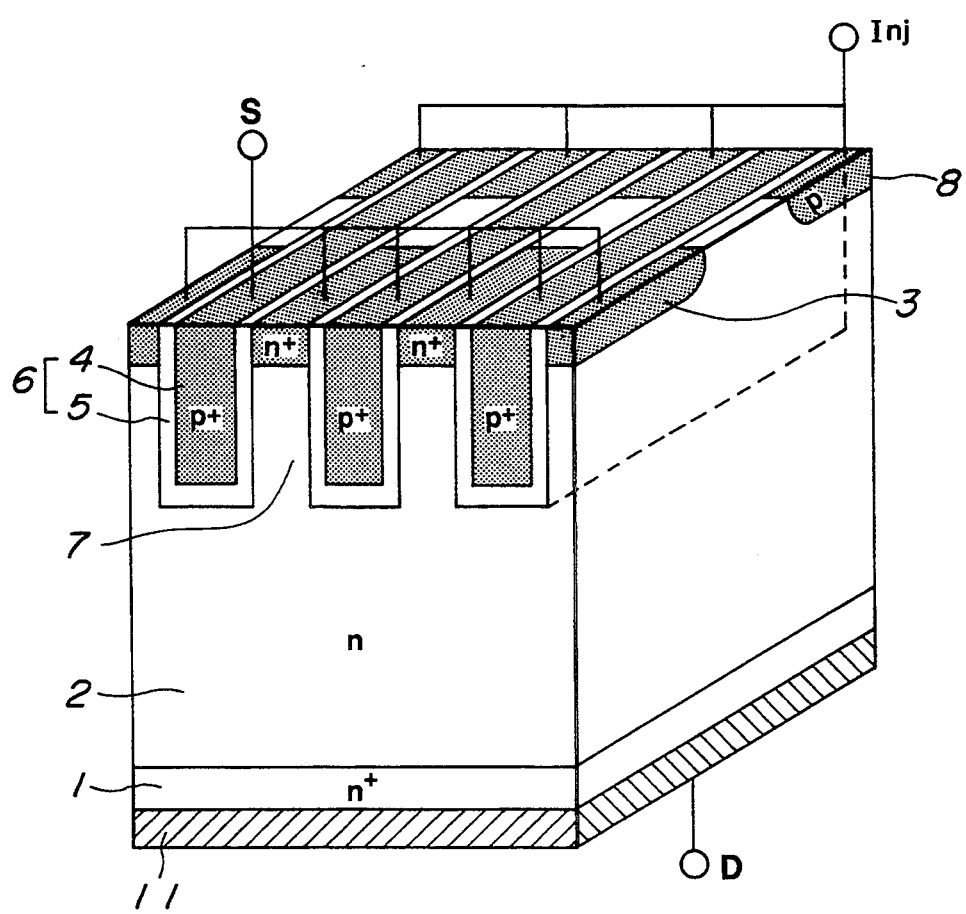
FIG. 8 is a perspective view of a structure of a semiconductor device in a first preferred embodiment according to the present invention.

FIG. 8 shows a perspective view for explaining a basic structure of the semiconductor device in the first embodiment according to the present invention.

Figure 9:
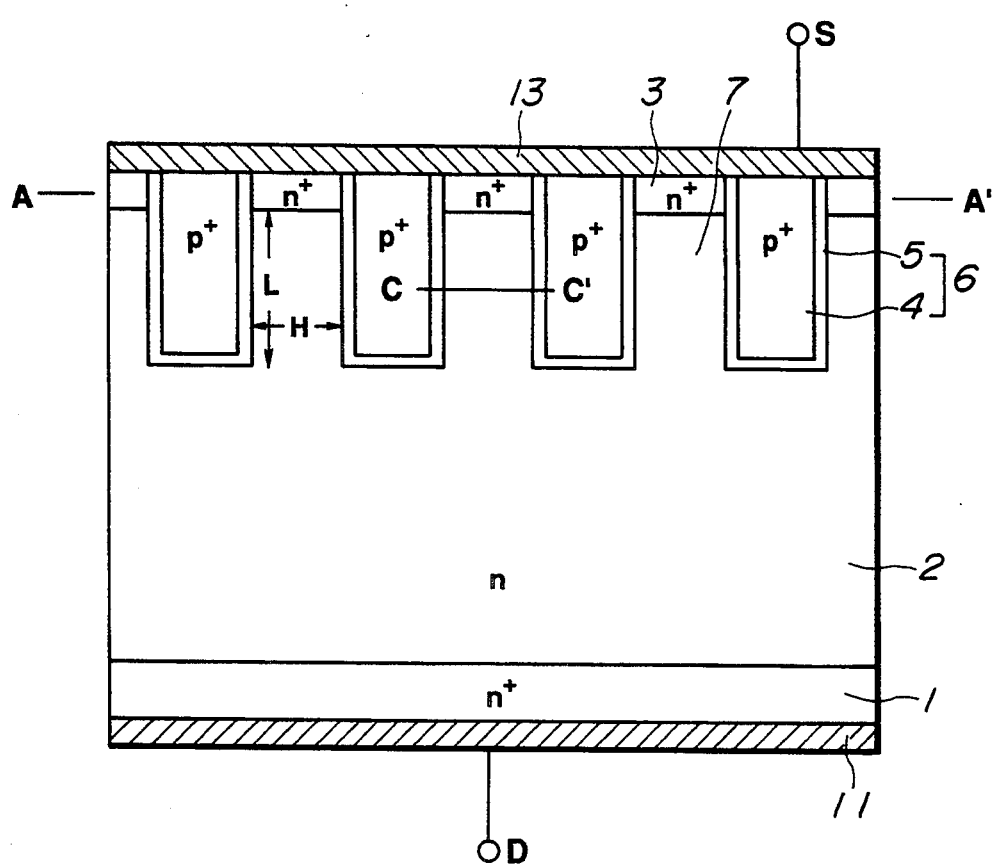
FIG. 9 is a cross sectional view of the structure of the semiconductor device being the same as FIG. 8, and is cut away along the line A-A' in FIG. 10.

FIG. 9 shows a cross sectional view of the semiconductor device indicating the same part of a front viewed area as viewed from FIG. 8.

Figure 10:
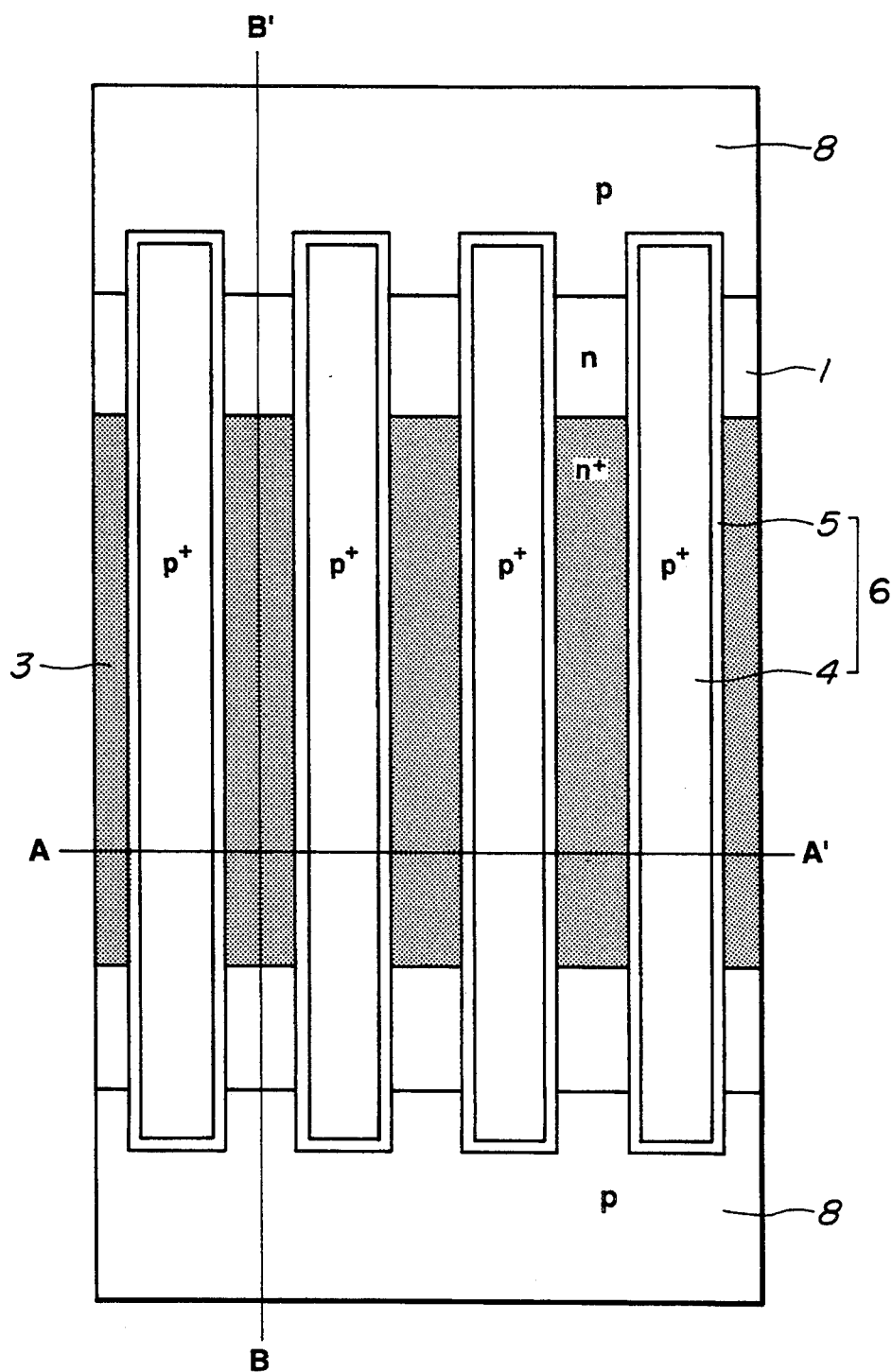
FIG. 10 is a cross sectional view of the structure of the semiconductor device that represents a surface pattern, and is cut away along the line of A-A' in FIG. 9.

FIG. 10 shows a cross sectional view of the structure of the semiconductor device cut away along the line A-A' in FIG. 9.

In FIGS. 8 and 10, a structure of the semiconductor device except a surface electrode (metallic film) is shown.

Figure 11:
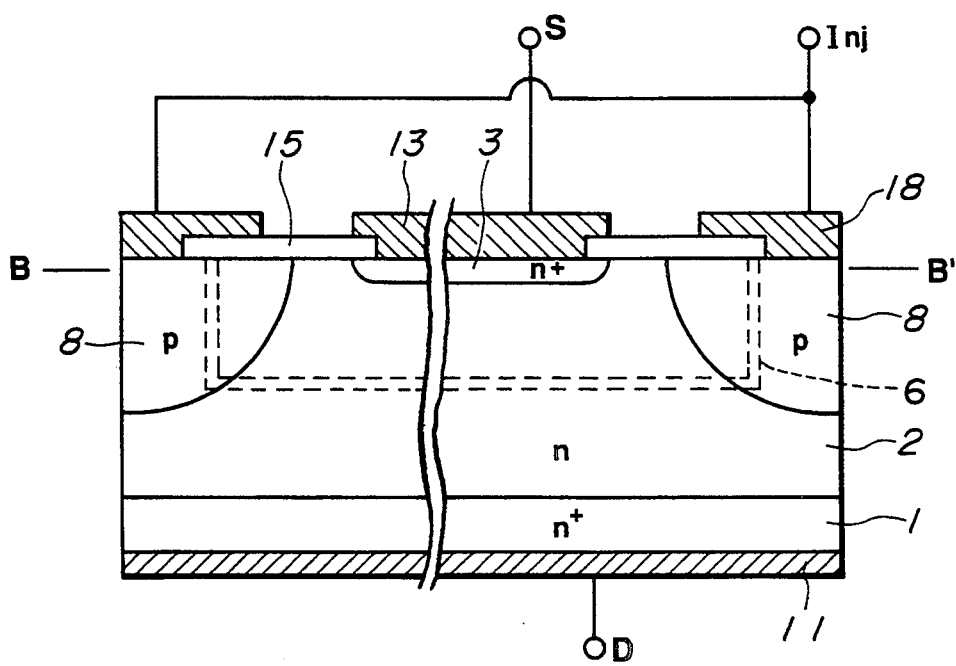
FIG. 11 is a cross sectional view of the structure of the semiconductor device cut away along a line of B-B' of FIG. 10

That is to say, FIG. 10 shows a cross sectional view cut away along a line of A-A' of FIG. 9 vertically from a paper surface of FIG. 9. On the contrary, FIG. 9 shows a cross sectional view vertically cut away along a line of A-A' of FIG. 10. In addition, FIG. 11 shows a cross sectional view vertically cut away along a line B-B' of FIG. 10. In the same way as FIG. 9, the cross sectional view cut away along a line B-B' of FIG. 11 corresponds to FIG. 10. It is noted that, in the first embodiment, the semiconductor material is made of silicon.

Next, the structure of the semiconductor device in the first embodiment will be explained below with reference to FIGS. 8 through 11.

In FIGS. 8 through 11, an n+ type semiconductor substrate 1 has two main surfaces. The n type drain region 2 is the layer formed on one of the main surfaces of the substrate 1. The impurity concentration of the drain region 2 is designed at a low level to withstand a high voltage. There are several straight trenches dug on the surface of the drain region 2, and their side surfaces are approximately vertical, and they are arranged in stripes. Also there are several n+ type source regions 3 that are on the top surface of the drain region 2, and are sandwiched by the striped trenches. Insulating films 5 are covered with the whole inner surfaces of the trenches, and the trenches are filled up with the p+ type polycrystalline silicon regions 4. And the potential of the polycrystalline silicon regions 4 are fixed to that of the source regions 3 by the source metal 13 which connects with both regions, as shown in FIG. 9. So the unit comprising the p+ type polycrystalline silicon region 4 and the insulating film 5 in a trench is referred to as the "potential-fixed insulated electrode" 6, hereinafter. The portion of the drain region sandwiched by the potential-fixed insulated electrodes is referred to as the "channel" 7 hereinafter. Depletion regions are formed in the n type region adjacent to the potential-fixed insulated electrode by the difference of work function value between the n type drain region 2 or the channel region 7 and the p+ type polycrystalline silicon region 4. The barrier for the conductive electrons which constitute a main current, is formed in the channel region 7 by this depletion region. Then, the n+ source region 3 and the neutral drain region 2 is, initially, disconnected from each other electrically.

Furthermore, the p type injector region 8 is formed on the surface of the device, that forms a p-n junction with the n type drain region 2, and it touches with every insulating film 5 at every end of the trenches, and it does not contact with the n+ type source regions 3 as shown in FIG. 10 and FIG. 11. Also in FIG. 11, the broken line predicts the existence of the potential-fixed insulated electrode beyond the channel region. And the layer 15 is the interlayer insulating film.

Additionally, the drain electrode metal 11 connects with the substrate 1 at the bottom surface of it. Furthermore, the metal 18 contacts with the p type injector region is referred to as the "injector electrode". And all the contacts between such metals and semiconductor regions as described above are ohmic contacts.

The length indicated as a letter "L" in the channel in FIG. 9 is the distance between the source region and the bottom surface level of the trench along the side surface of the trench. The length "L" is referred to as the "channel length" of the device, hereinafter. And also the length indicated as a letter "H" in the same channel region is the distance between the insulating films mutually facing in the channel. The length "H" is referred to as the "channel thickness", hereinafter.

In the first embodiment, each surface pattern of the potential-fixed insulated electrodes 6 is a bar-shape, and a plurality of the potential-fixed insulated electrodes 6 are arranged in stripes. And every end of the electrodes 6 touch the p type injector region 8. Thus a channel surrounded by some potential-fixed insulated electrodes 6 and some p type injector region can form a "unit cell" of the device. (In case of FIG. 10, four units cells are illustrated.) In this way, if the condition that the channel can interrupt or control the current by its condition is satisfied, the cross sectional shape of the potential-fixed insulated electrode and the shape of the source region, both of which constitute a unit cell, may be arbitrary.

Figure 15:
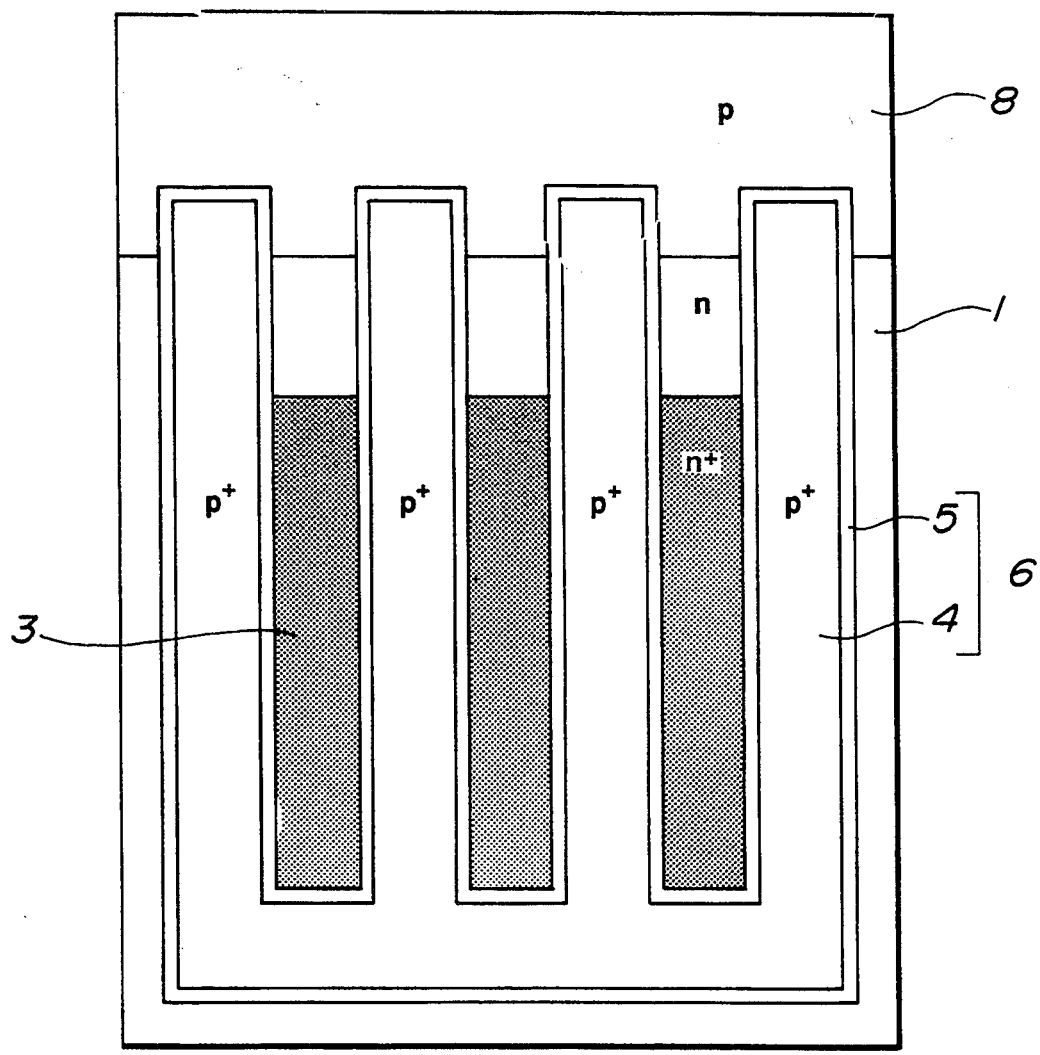
FIG. 15 is a cross sectional view of a variant pattern of a surface structure in the first preferred embodiment, that is the same situation as FIG. 9.

For instance, FIG. 15 shows another type of "unit cell" different from that in FIG. 10. In FIG. 15, every ends of the bar-shaped trenches located on the same side are connected mutually and form a pattern like teeth of a comb. The merit of this pattern is that the p type region 8 is needed only one side of the unit cell, although the pattern in FIG. 10 needs two p type regions 8.

Figure 16:
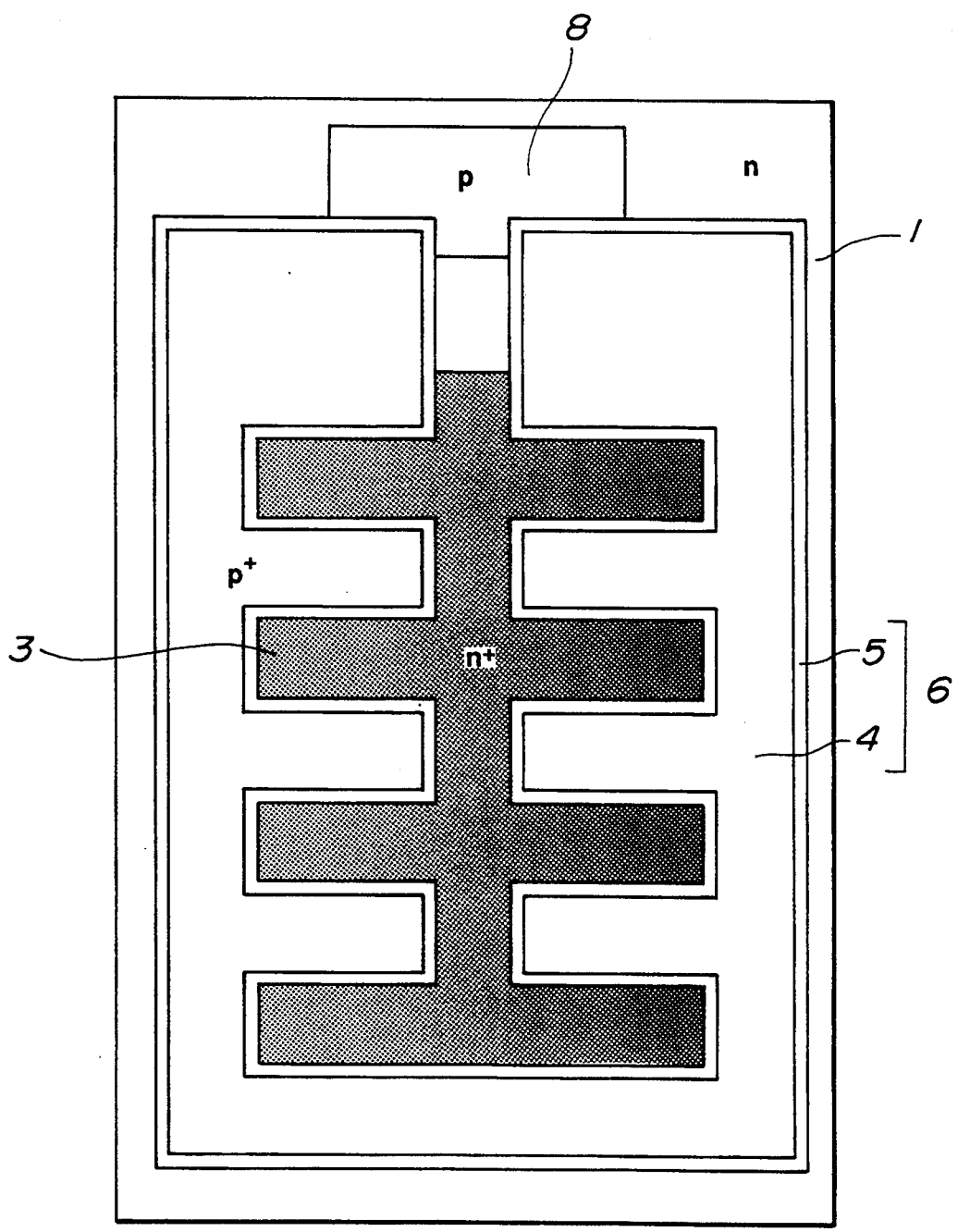
FIG. 16 is a cross sectional view of another modification of a surface structure in the first preferred embodiment according to the present invention shown in FIGS. 8 through 11.

Furthermore, the pattern shown in FIG. 16 may also be called a "unit cell". In this pattern, the point is the shape of the source region, so the outer sides of the trench may be linked with adjacent unit cells.

It is noted that in the illustrations of the cross sections of the semiconductor devices, corners of the insulating film are drafted in sharp. But it is not essential to the present invention. Such corners in actual embodiments may often be made in round. Rounding these corners to reduce the concentration of the electric field is well known technique in the semiconductor technology.

Operation of the Device

The operation of the device according to the present invention will be explained below. And the conditions to satisfy the normally-off characteristic will also be explained.

A positive potential is applied to the drain electrode D and the source electrode S is grounded (set to 0 V). When the potential of the injector electrode 18 is grounded, the device keeps the off-state. As mentioned above, the source region 3 and neutral drain region 2 are disconnected from each other electrically by the depletion region in the channel, which is generated by the difference value of the work functions between the p+ type region of the potential-fixed insulating electrode and n type channel region.

Generally, in such a MOS diode-like structure, when a high reverse bias is applied to the structure to extend the depletion region, the width of the depletion region is held in a range by the existence of an inversion layer on the surface of the insulating film. When the depletion region is formed, the minority carriers, that is, holes in this case, are generated therein, and they gather on the surface of the insulating film and form an inversion layer. The inversion layer serves to shield the electric field from the insulated electrode to the semiconductor region held in a range. And according to gathering the holes, the surface potential of the insulating film may increase. But at the structure of the present invention, and at this situation, the surface potential is fixed and the depletion region is extended as the applied potential, because the grounded p type region 8 contacts the surface of the insulating film 5, so that the holes gathered on the surface of the insulating film 5 can flow out through the p type region.

Figure 12:
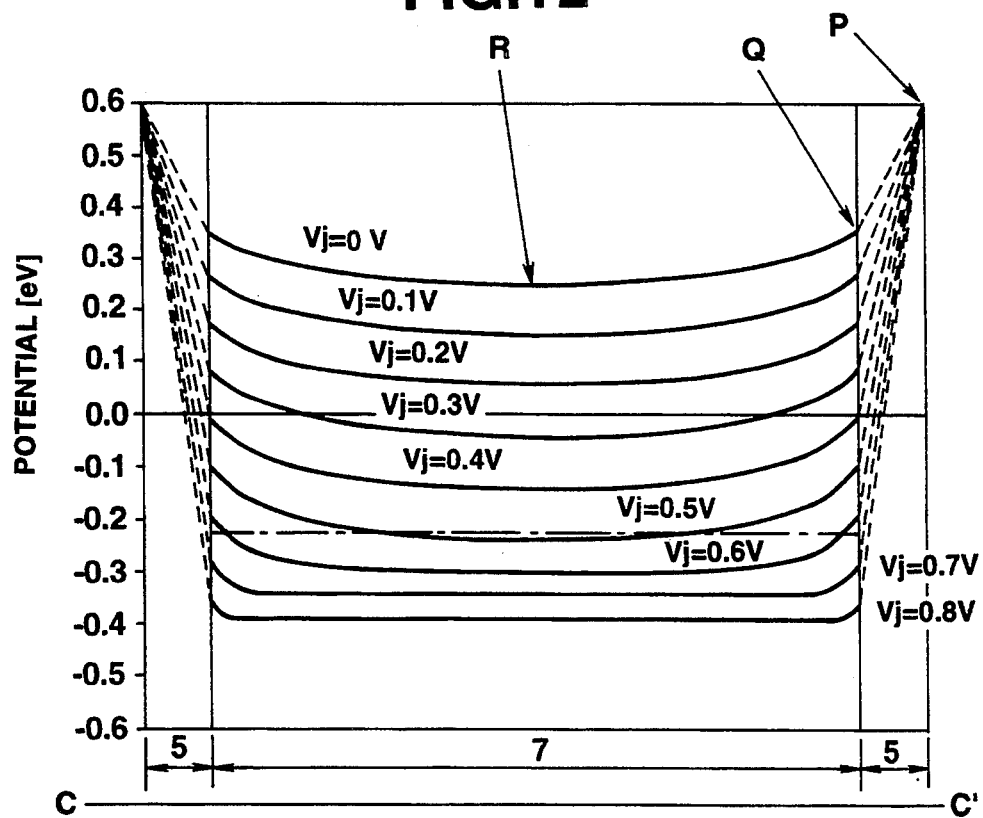
FIG. 12 represents a potential distribution in the channel region along the line C-C' in FIG. 10.

The structure of the device according to the present invention must satisfy two conditions to keep the normally-off characteristics. One is concerned with the "channel thickness" H defined above and represented in FIG. 9 and with an impurity density of the channel region. FIG. 12 represents the calculated potential distribution in the channel along the line C–C' in FIG. 9, that runs approximately the center point of the channel. The vertical axis of FIG. 12 denotes an energy potential of a mid-point of the energy-band, "the energy potential of a mid-point of the energy-band measured from the Fermi level" is referred simply to as the "potential" with double quotations hereinafter to distinguish from an electrical potential. In FIG. 12, the potential distribution was calculated supposing that the "potential" of the p+ type region of the potential-fixed insulated electrode was 0.6 eV, and each insulating film 5 is made of silicon dioxide, and its thickness was 100 nm.

The dashed lines in FIG. 12 indicate the potential distributions in the insulating films. And the chained line indicates the potential level of the semiconductor of the channel region at its neutral state.

In FIG. 12, when the potential of the injector electrode $V_j$ is 0 V, the "potential" of whole region of the channel is positive, so that the conductive electrons cannot exist there. To satisfy such a condition, the impurity concentration in the channel region $N_D$, the channel thickness H, and the thickness of the insulating film $t_{OX}$ must satisfy the following formulae.

First, when the "potential" of the p type region of the potential-fixed insulated electrode represents P, and the "potential" of the interface between the insulating film and the channel region represents Q, the following equation (1) must be satisfied because the electric field in the insulating film is constant.

$$E_{OX} = \frac{P - Q}{t_{OX}} \quad (1)$$

Where, $t_{OX}$ is the thickness of the insulating film and $E_{OX}$ is the strength of the electric field in it.

On the other hand, since the whole channel region in the off-state is depleted, the "potential" distribution $V_{ch}$ can be approximated on a quadratic equation (2).

$$V_{ch} = \frac{q \cdot N_D}{2\epsilon_{si}} X^2 + R \quad (2)$$

Where, q is the electric charge unit, $\epsilon_{si}$ denotes a permittivity of the silicon, X denotes a distance from the midpoint to a point of the channel measured along the line C–C' in FIG. 9, and that denotes the distance from the center of the "region 7" to a point at any direction of the horizontal axis in FIG. 12, R denotes the minimum value of the "potential" in the channel region. And Q, that is, the "potential" of the interface between the channel region and the insulating film must satisfy the following equation (3).

$$Q = \frac{q \cdot N_D}{2\epsilon_{si}} (H/2)^2 + R \quad (3)$$

Also the electric field at this point $E_{si}$ is expressed as follows:

$$E_{si} = \frac{q \cdot N_D}{\epsilon_{si}} (H/2) \quad (4)$$

Furthermore, since the electric field flux at any boundary must be continuous in general, the following equation (5) must be satisfied.

$$\epsilon_{ox} \cdot E_{ox} = \epsilon_{si} \cdot E_{si} \quad (5)$$

Figure 13:
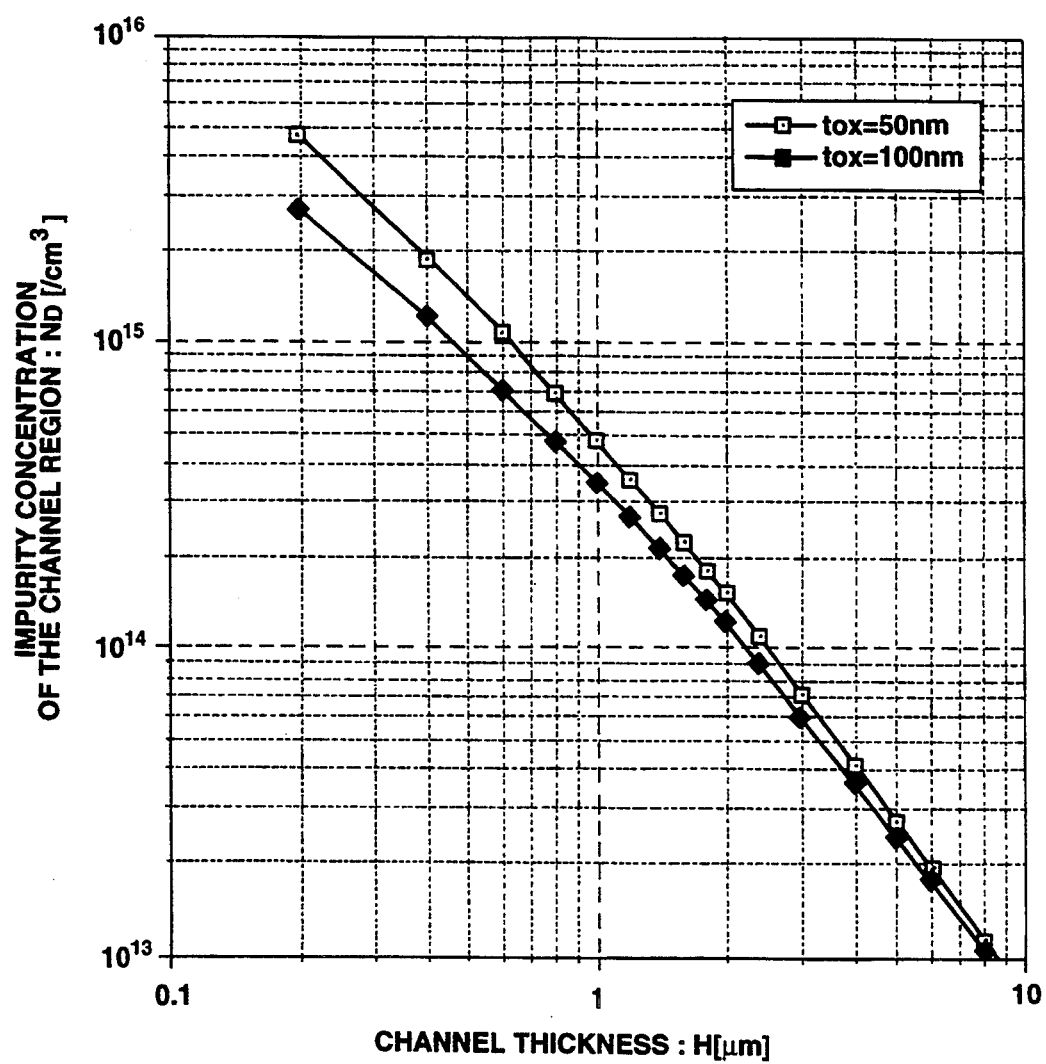
FIG. 13 is a plotted view of relationships between an impurity concentration, insulating film thickness, and channel thickness in the channel regions of the first embodiment shown in FIGS. 8 through 11.

In the equation (5), $\epsilon_{ox}$ denotes the permittivity of the insulating film in the above equation. FIG. 13 shows relationships between $N_D$, the impurity density in the channel and H, the channel thickness and $t_{ox}$, the thickness of the insulating film which satisfy all of the equations (1) through (5) above described. And at the calculation of FIG. 13, the "potential" of the p type region of the potential-fixed insulating electrode is set to 0.6 eV, and R, the minimum of the "potential" in the channel, is set to 0.3 eV considering an accidental noise not to open the channel easily. FIG. 13 shows two lines. One is that in case of the $t_{ox}=50$ nm, and the other is that in case of the $t_{ox}=100$ nm. Anyway, the device according to the present invention must be given by the point in the lower-left zone of any line in FIG. 13 to achieve the normally-off characteristic. For instance, when $N_D$ is $1 \times 10^{14}$ cm$^{-3}$ and H is 2 μm, this set of parameters satisfies the condition at and $t_{ox}$ of two described above.

Figure 14:
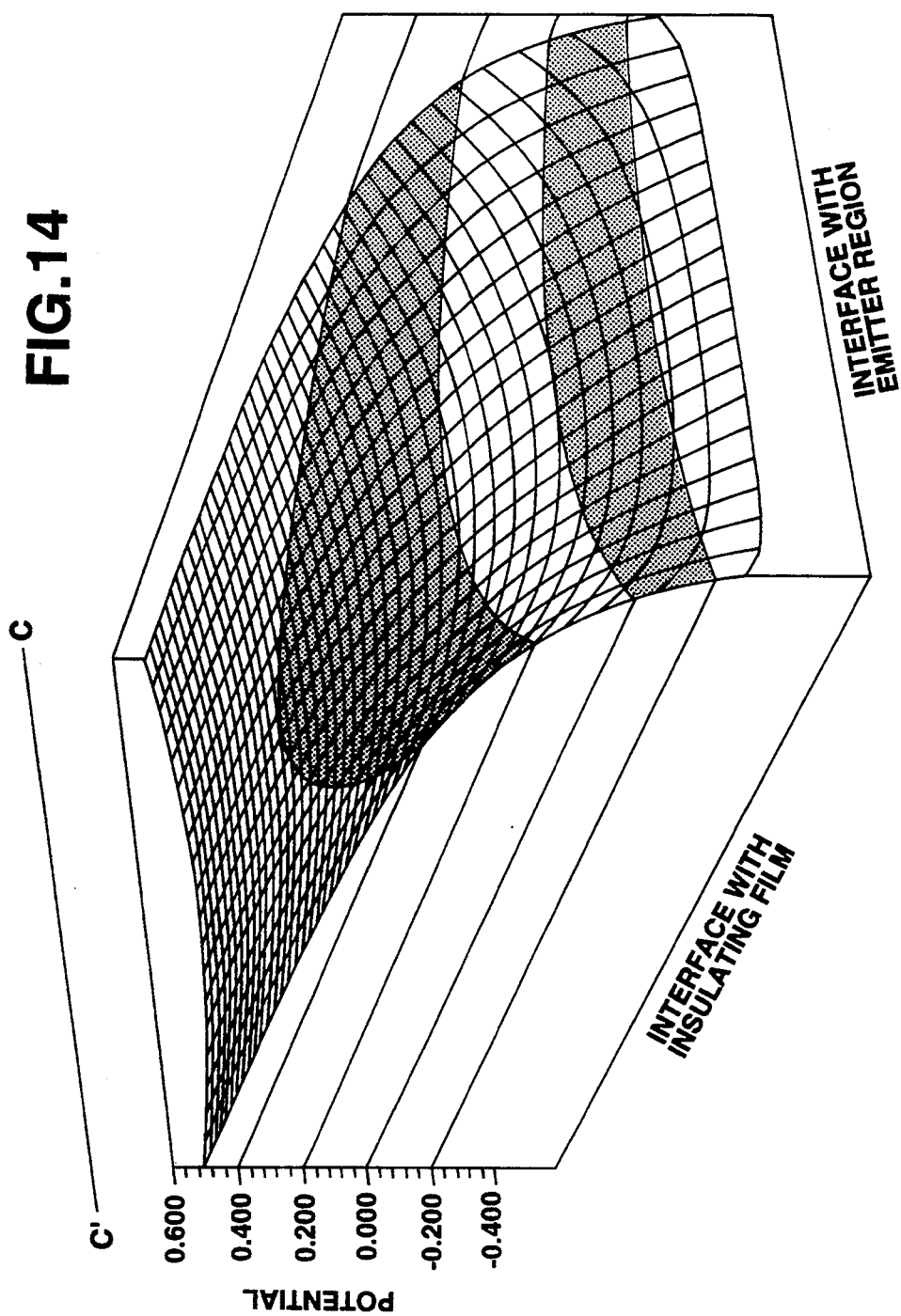
FIG. 14 is a three-dimensional plot of the potential distribution in the channel regions of the first preferred embodiment shown in FIGS. 8 through 11.

Second condition for the device according to the present invention to have the normally-off characteristic is about the channel thickness H and the channel length L. FIG. 14 shows a result of the numerical calculation of the "potential" distribution in the channel region 7. In this perspective view of the "potential", the base plane is the channel region in FIG. 9 virtually viewed from approximately the side of the source region to the center of the channel, the lines C–C' indicated the upper side (depth side) of FIG. 14 is the same as the in FIG. 9. And the vertical axis denotes the "potential". The lines sandwiches the colored zones in FIG. 14 represent equipotential lines. The potential adjacent to the source region (not shown in FIG. 14) is pulled down due to the effect of the source region. But at the region adjacent to the line C–C', the center region of the channel, there is substantially no influence of the source region, and the "potential" distribution there is the same as that in FIG. 14 of $V_j=0$ V.

From the results of the same calculations at several points that satisfy the first condition in FIG. 13, it is achieved that the influence of the source region on the channel region extends the length up to 1 or at most 1.5 of H, the channel thickness along the surface of the insulating film in the channel. On the other hand, at the portion of the channel region facing to the drain region, the "potential"-pulling-down by the electric field from the drain region is approximately the same situation as described above. Therefore, the condition that the channel would not open due to the influence of the electric field from the drain region, is L/H (the ratio of the channel length of the channel thickness) being more than 2 or 3.

Next, the mechanism of the device according to the present invention to change its state from the off-state to the on-state will be explained below.

When the potential of the injector electrode Vj=0 V, the channel is in the off-state as described above. Then, when the potential applied to the injector electrode raises up to 0.3 V, a negative "potential" region appears in the center portion of the channel region as shown in FIG. 12, so that the electrons can flow in the channel region, that means the device turns to the on-state. The reason why the "potential" distribution of the channel decreases when the potential of the injector electrode increases is as follows:

When the potential of the injector electrode increases, the potential of the p type injector region 8, which is in the ohmic contact with the injector electrode 18, increases. Then the holes are supplied to the surface of the insulating film in the channel, because the p type injector region 8 touches the insulating film 5 of each potential-fixed insulated electrode 6. The supplied holes, the minority carriers for the channel region, shield the electric field from the p type region 4 of the potential-fixed insulated electrode to the n type channel region. Thereby the width of the depletion region in the channel reduces and the neutral region appears.

When the potential of the injector electrode is raised up to more than 0.5 V, the negative "potential" area in the channel in FIG. 12 becomes lower than the chained line indicated in FIG. 12, the chained line denoting the "potential" of the neutral state of the channel region semiconductor. And the profile of the "potential" distribution in the channel becomes flat. This is because that the p-n junction between the p type injector region 8 and n type region is forward biased, and the n type channel region (and the n type drain region) gets into the high-level-injection state. In this state, the holes are supplied not only from the p type region 8 directly but also from the surface of the insulating film 5 of the potential-fixed insulated electrode 6. That is to say, the surface of the insulating film functions as a high conductivity hole current path.

At this state, it is easier to understand the control of the device by the "injection current" rather than the injector electrode potential, like a general bipolar junction transistor. This is because, the conductivity of the drain region is controlled by the quantity of the injector hole current.

Next, the mechanism of the device according to the present invention to change its state from the on-state to the off-state will be explained below.

To turn-off the device, it is enough to set the injector electrode potential to 0 V. Furthermore, a negative voltage may function as a shut-down signal. Then the hole injection stops, and the excess of holes present in the n type drain region and the channel may die out by recombination or flow away out of the device through the p type injector region 8. And the channel is filled by the depletion region again.

By the way, in FIG. 11, the p type region 8 is drawn so as to extend up to a portion of the device deeper than the bottom of the potential-fixed insulated electrode that is represented in broken lines. Such formation has a merit to accelerate the turn-off of the device when a negative potential is applied to the injector electrode. But is the case of a shallow junction like in FIG. 8, there is no problem on the other characteristics and operation of the device.

This I-V characteristics is a pentode-like, approximately similar to a single bipolar junction transistor. The drain current can flow sufficiently by control of the "injector current" even if the drain potential is low. When the drain potential increases, the drain current becomes saturated because the pinch-off according to the depletion region extended from the surface of the insulating film into the drain region. In addition, $h_{FS}$ (a current amplification factor in the case where the source is grounded and the same as a bipolar junction transistors' $h_{FE}$) can be defined because the injection current controls the main current. This device can achieve a high $h_{FS}$ because the unit cell size is very small and the potential of the channel region directly interlocks with that of the injector electrode 18.

Method of Fabrication

Next, some preferable methods of fabrication of the device according to the present invention will be explained below.

FIGS. 19 through 24 show perspective views of successive stages of a fabrication of the device shown in FIGS. 8 through 18.

Figure 19:
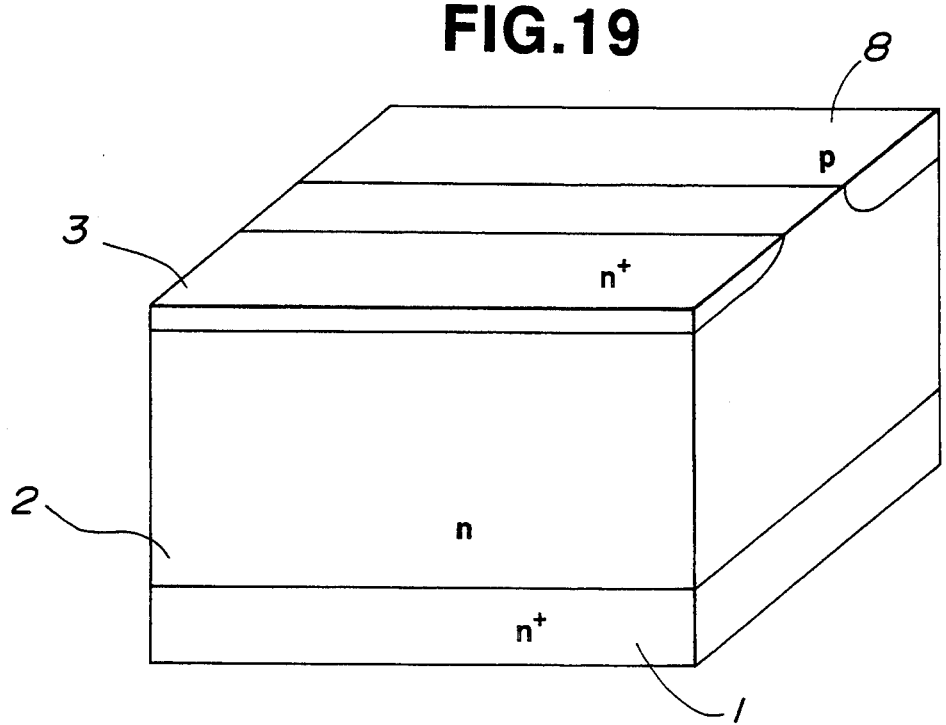
FIGS. 19 through 24 are perspective views of the successive stages of the process of fabricating the semiconductor device in the embodiment of the present invention which realize a modification of the basic structure of the device.

(1) As shown in FIG. 19, the n type drain region 2 is formed on a main surface of the n+ type substrate which is the substrate region 1 by means of an epitaxial growth. Furthermore, on an upper surface of the n type drain region, an n+ type region, which serves as the source region 3, and a p type region, which serves as the injector region 8, are formed and spaced apart from each other. To facilitate the understanding of the structure, the depth of the p type region 8 is drawn so to become shallower than that of each spaced apart potential-fixed insulating electrode 6 (not shown in FIGS. 19 through 21).

Figure 20:
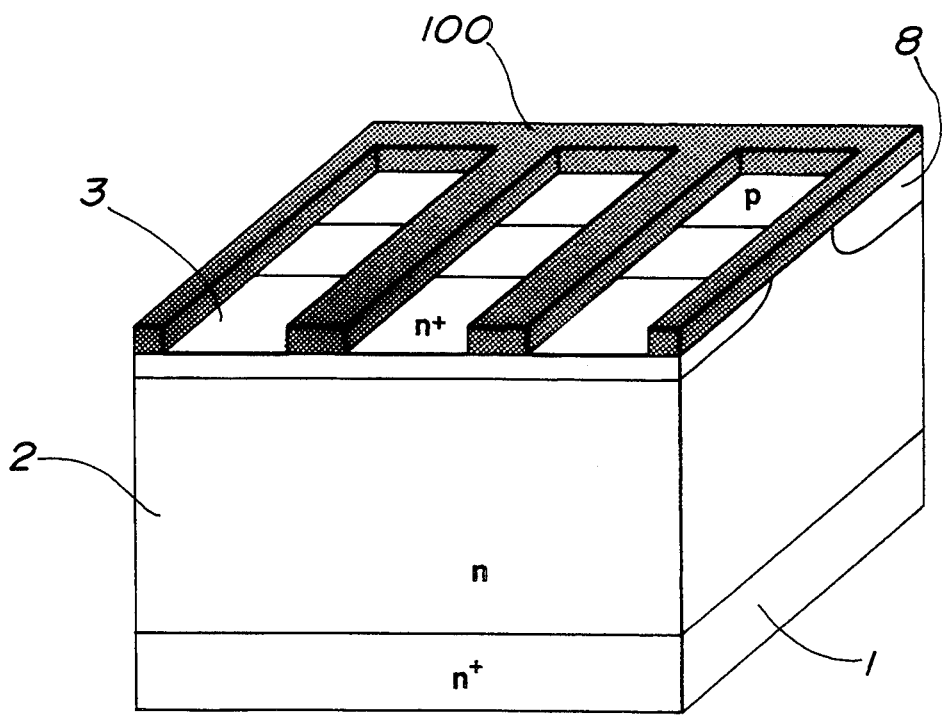
Figure 21:
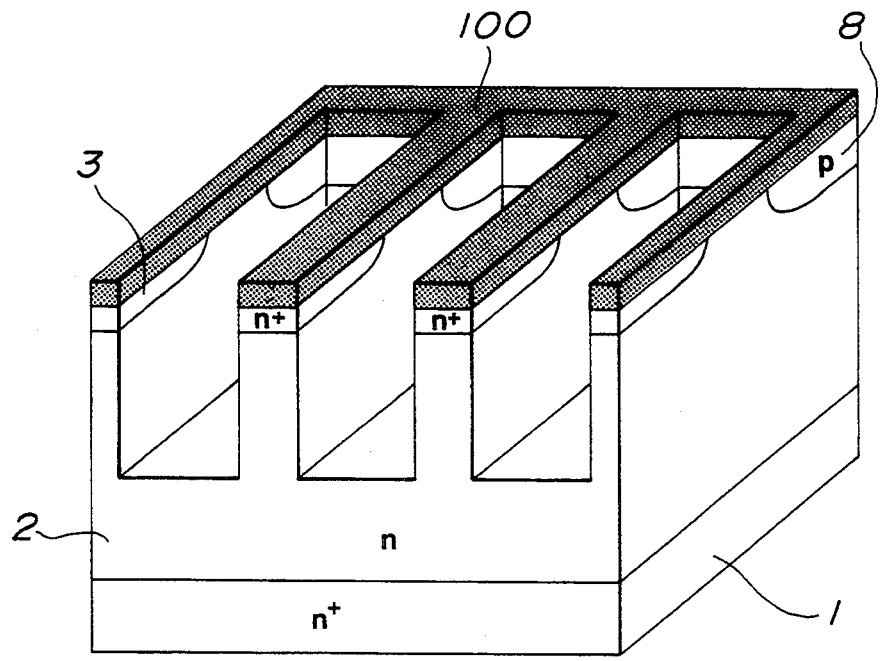

(2) As shown in FIG. 20, a mask material 100 is formed on upper surfaces of the source regions 3, drain region 2, and injector region 8 to provide a pattern to form the trenches for the potential-fixed insulated electrodes 6. This is etched by means of an anisotropocal dry etching so as to form the trenches whose side walls are approximately vertical with respect to the main surface, as shown in FIG. 21. The depth of each trench is twice, triple or more a spatial interval between the mutually adjacent trenches.

A cross sectional profile of each trench, i.e., the form of each of the potential-fixed insulated electrodes 6 is exemplified by FIG. 9 or FIG. 21 in which letters of U-shaped trenches are formed. Each side wall is vertically extended with respect to the main surface of the substrate region 1. If the above-described two channel conditions are satisfied to provide the normally-off type device, the cross sectional profile of each potential-fixed insulated electrode 6, i.e., each trench may alternatively be a barrel shape, wedge shape, rhombus shape or slanting "U"-shape. If physically possible, the potential-fixed insulated electrodes 6 may completely be buried into the substrate region 1.

In addition, about the surface patterns, as far as the channel-off-state conditions described above are satisfied, the uniformity of the channel thickness and that of the trench width is not essential.

Figure 22:
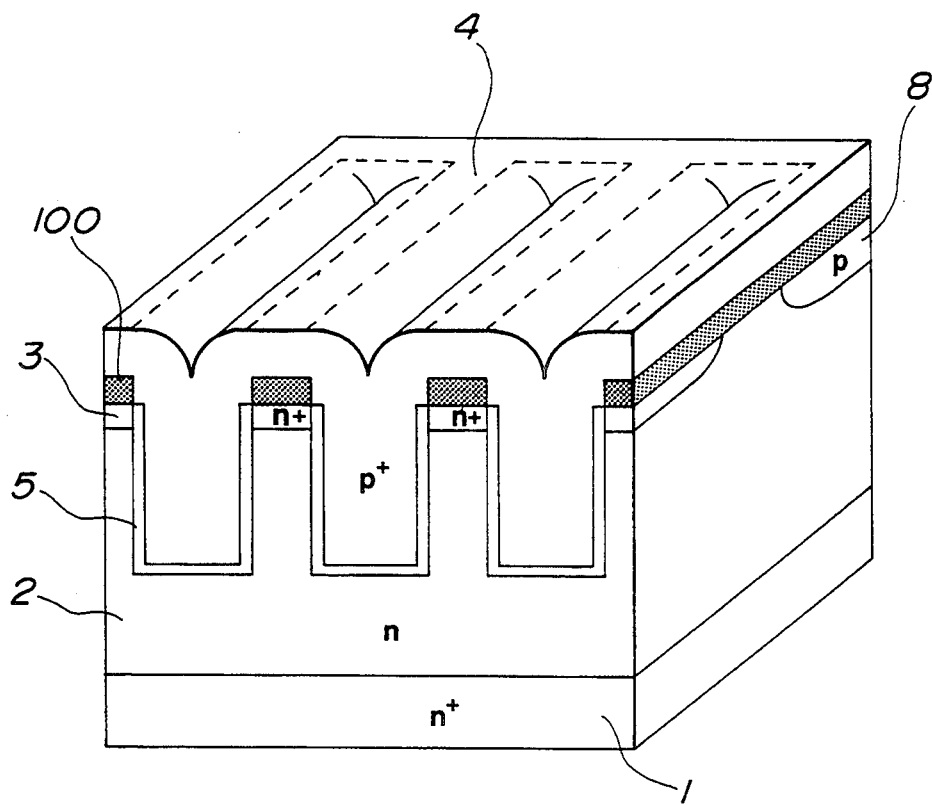

(3) As shown in FIG. 22, inner surfaces of the trenches are oxidized to form the insulating films 5 and the trenches are filled up by a highly dopes p type polycrystalline silicon. At this time, the masking material 100 functions as a mask against oxidization.

Figure 23:
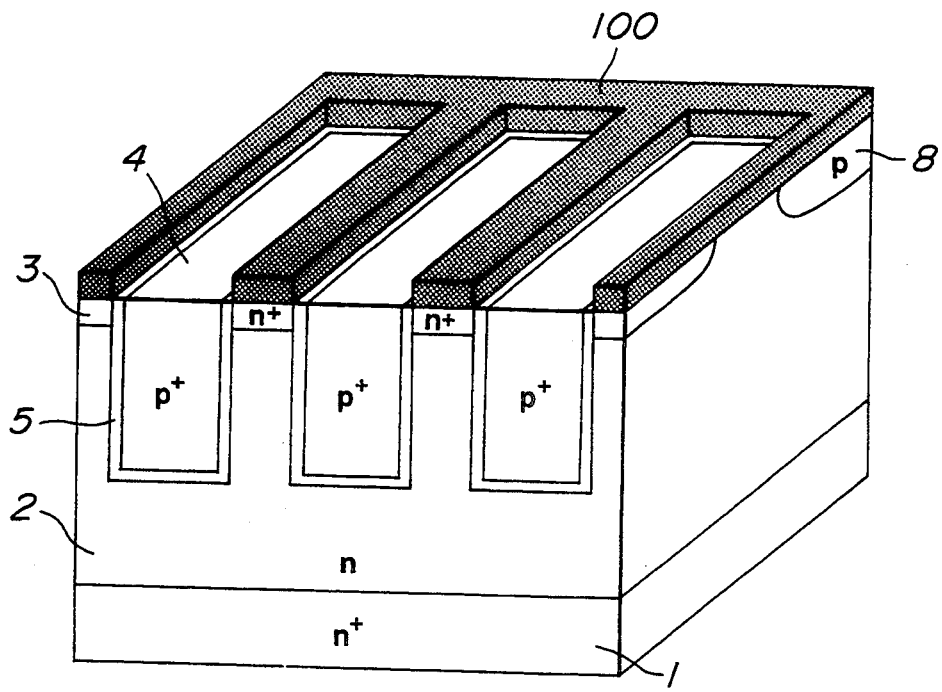

(4) Then, the polycrystalline silicon is etched back to remain it only in the trenches as shown in FIG. 23. At this time, the masking material 100 functions as mask against the silicon etching again.

Figure 24:
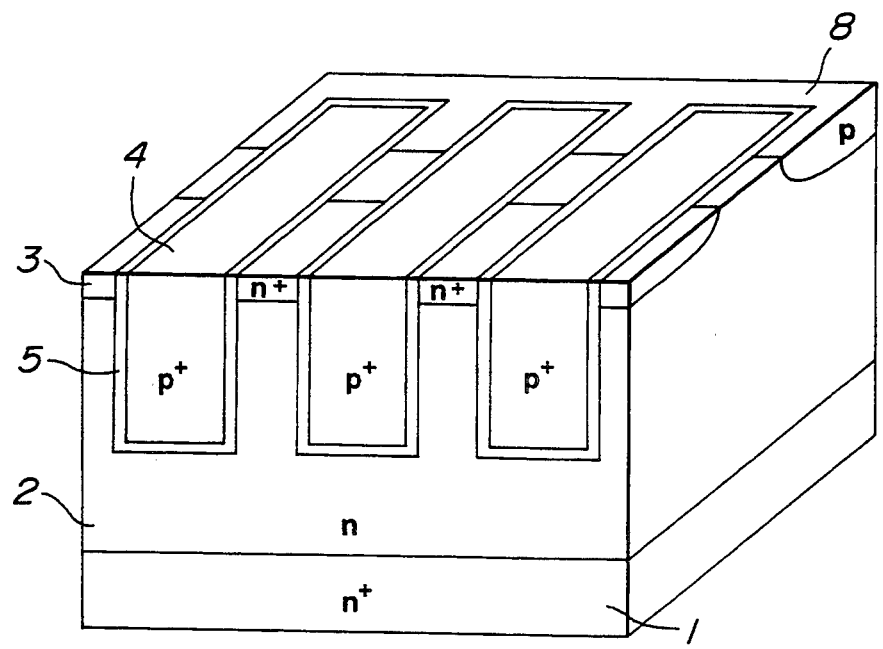

(5) As shown in FIG. 24, the mask material 100 is eliminated and, thereafter, interlayer insulating films 15 (shown in FIG. 11) and the metallic electrodes are formed to achieve the structure of the semiconductor device shown in FIGS. 8 through 11.

It is noted that the conductive portions of the potential-fixed insulating electrodes 6 may alternatively be the same metal as the source electrode, if the conditions that the channel would not be open by the electric field from the drain region when the potential of the injector electrode 18 is in the off-state.

Next, another manufacturing method of the first embodiment device will be explained using the successive cross sectional views of FIGS. 25 through 27.

This method can realize the channel thickness H be more finer. It is noted that FIGS. 25 through 29 show the cross sectional views of the surface regions only related to the explanations below.

Three layered film consisting of a thin oxidized silicon film 101, a silicon nitride film 102 and a CVD oxide film 103 are used for the masking material 100 as shown in FIG. 20. And, at first, only the CVD oxide film 103 and the silicon nitride film 102 are under the patterning process.

Figure 26:
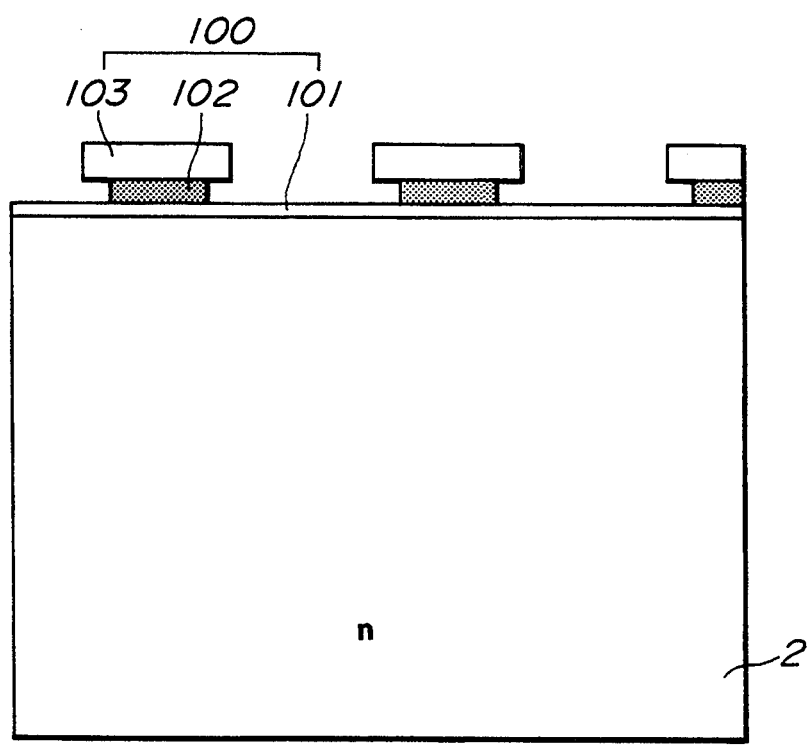

Next, only the silicon nitride film 102 is etched by means of an isotropical etching to some extent as shown in FIG. 26. Thereafter, the CVD oxidation film 103 is eliminated so that the remaining silicon nitride film 102 serves as the mask to form the trenches on the silicon substrate as shown in FIG. 27.

According to this series of manufacturing method, if 1 μm side-etching is carried out for the silicon nitride film 102 at a step of manufacturing process of FIG. 26, the channel width H can have 2 μm even if a normal minimum limit of, for example, the photo patterning is 4 μm.

Figure 25:
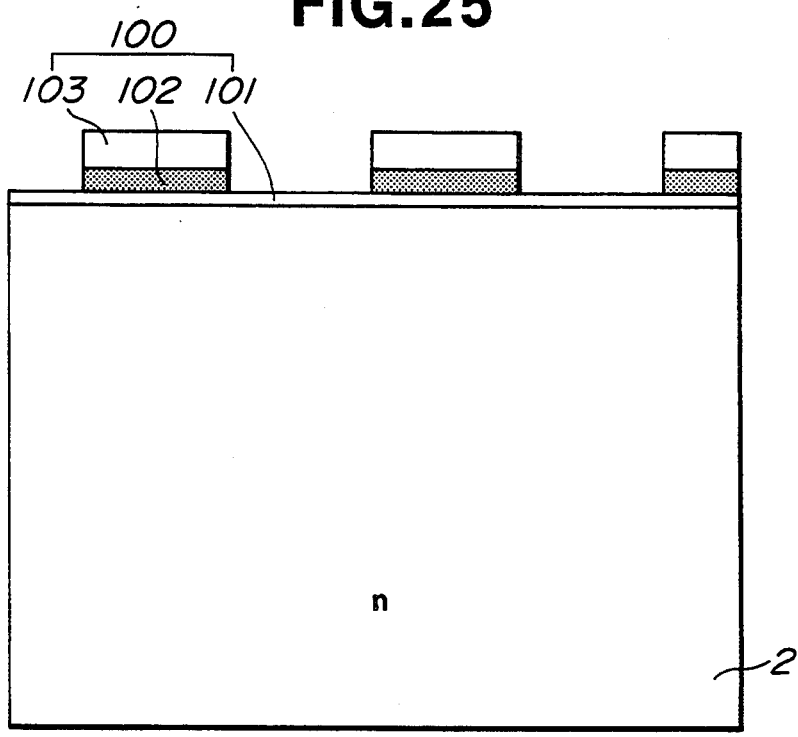
FIGS. 25 through 27 are cross sectional views of a part of the successive states of the process of fabricating the semiconductor device in the embodiment according to the present invention which realizes a modification of the basic structure of the device.
Figure 27:
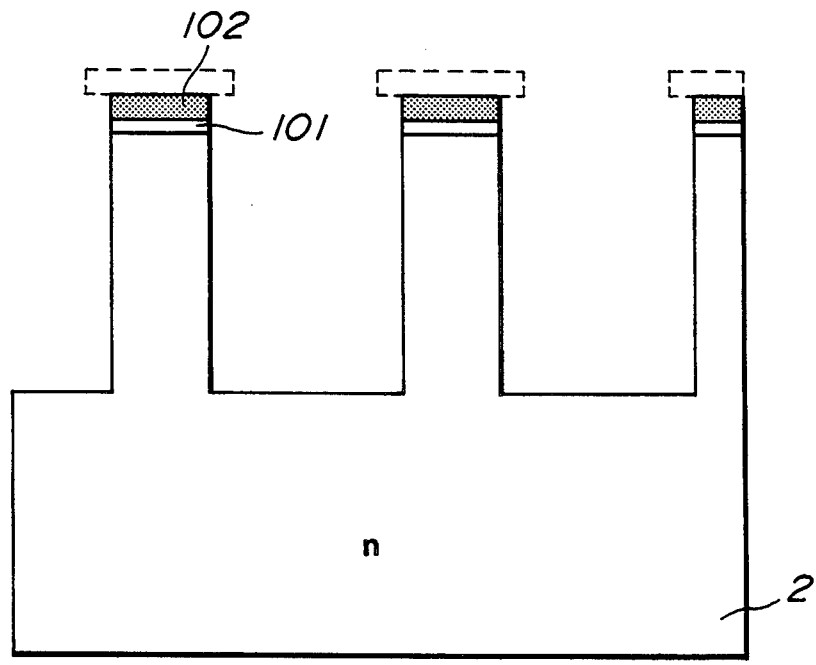

The advantages of the manufacturing method whose processes are shown in FIGS. 25 through 27 are as follows:

That is to say, the channel structure can be smaller-sized. Especially, as the channel thickness H becomes smaller, the channel length L can accordingly be shorter.

(1) The manufacturing process becomes simpler, since the depth of the trenches can be shallowed.

(2) The on-resistance may become lower, because the channel length can be shortened.

(3) The $h_{FS}$ may increase, because the whole surface area of the insulating films becomes smaller so that the surface recombination therein is decreased.

Next, still another method of fabrication of the device to improve the characteristics will be explained using FIGS. 28 through 31.

Figure 28:
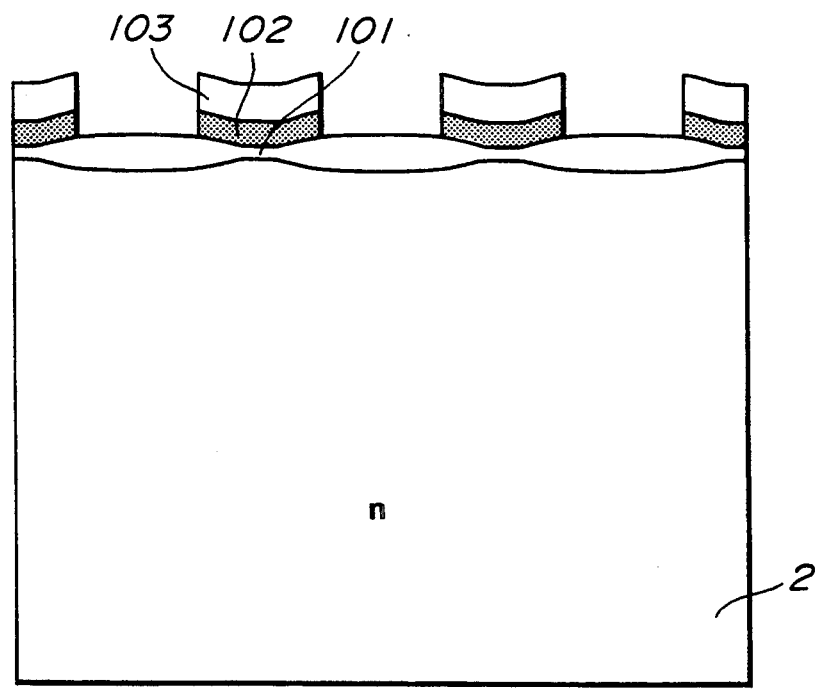
FIGS. 28 through 31 are cross sectional views of a part of the successive stages of the process of fabricating the semiconductor device in the embodiment of the present invention which realize another modification of the basis structure of the device.

After the stage of fabrication in FIG. 25, oxidization of LOCOS (LOCalized Oxidization of Silicon) is carried out to form such as that in FIG. 28. The bird's beaks are formed under the masking films 102.

Figure 29:
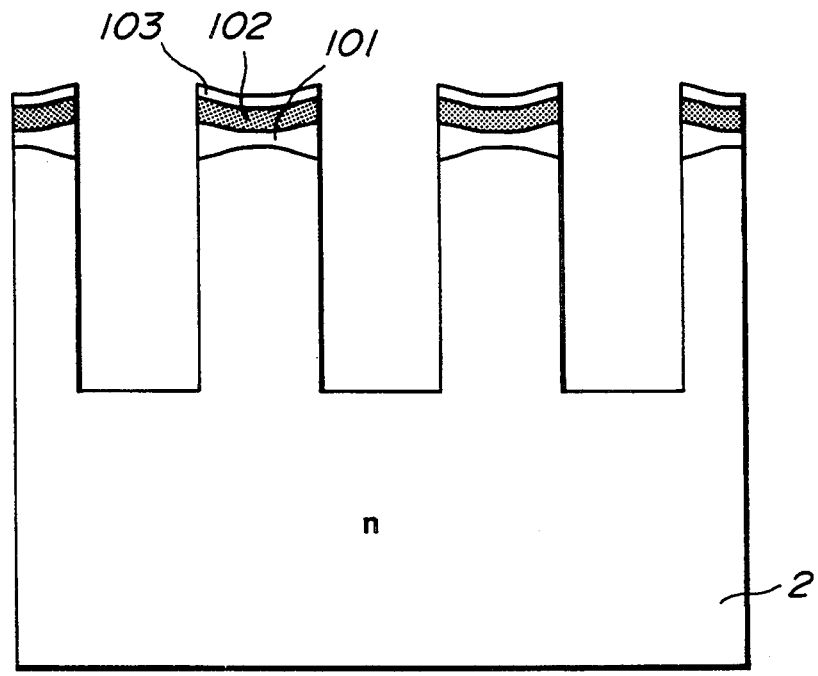

Then, an anisotropical dry etching is carried out for the thick "oxide film" formed by LOCOS and for the drain region to dig trenches, as shown in FIG. 29. The step of process as shown in FIG. 28 may or may not be carried out during the process described above.

Figure 30:
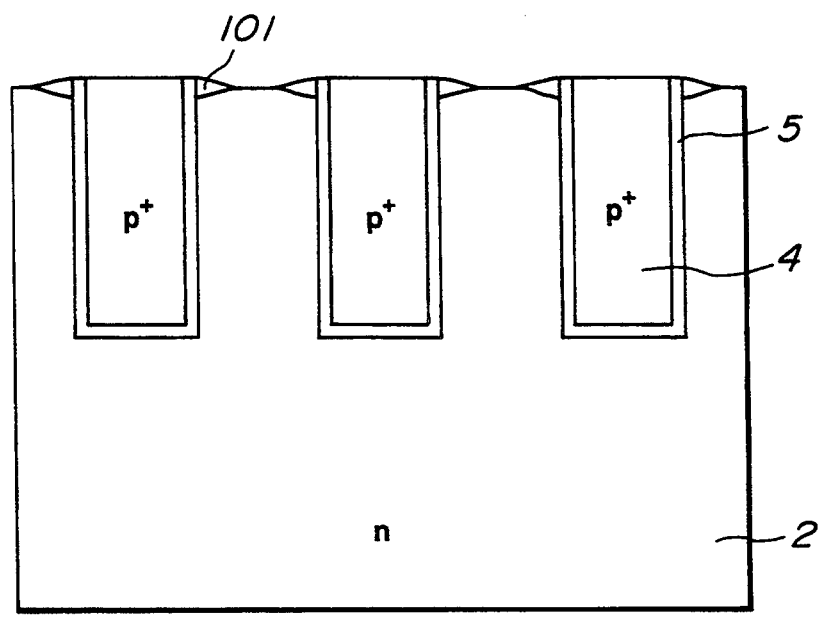
Figure 31:
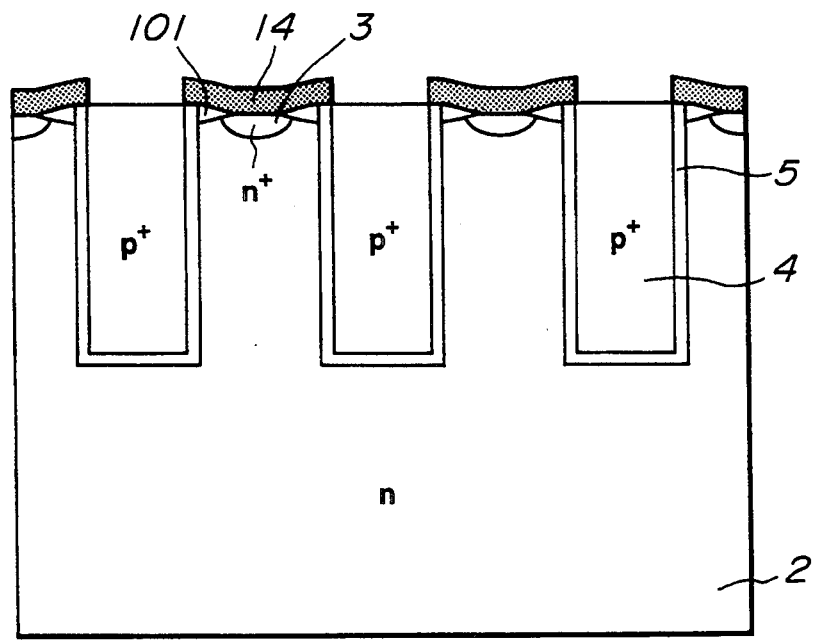

Next, after the steps as shown in FIGS. 21 through 23 are carried out, the masking films 103, 102, 101 are removed to expose the portion of the drain region which had touched with the thin oxide silicon 101, as shown in FIG. 30. A polycrystalline silicon film 14 is deposited on the surface of it and n type impurity atoms are ion implanted at the surface of the polycrystalline silicon film 14. After this step, the portions of the film 14 on p+ type polycrystalline silicon 4 in the trenches are locally removed to expose the region 4 and a light annealing is carried out to diffuse the n type impurity in the film 14 and, furthermore, in the drain region 2 (channel region) to form the n+ type source region 3 as shown in FIG. 31.

The advantages of this method described above are as follows:

(1) The size of the source regions can be shrunken by the width of the bird's beaks.

(2) The carrier recombination rate can be reduced because the interval formed between the source region 3 and the surface of the insulating film 5.

(3) The drain current can be controlled by less injection current because this is so-called "polysilicon emitter structure", so that the injection of the minority carriers into the source region is suppressed.

Second Embodiment

Figure 17:
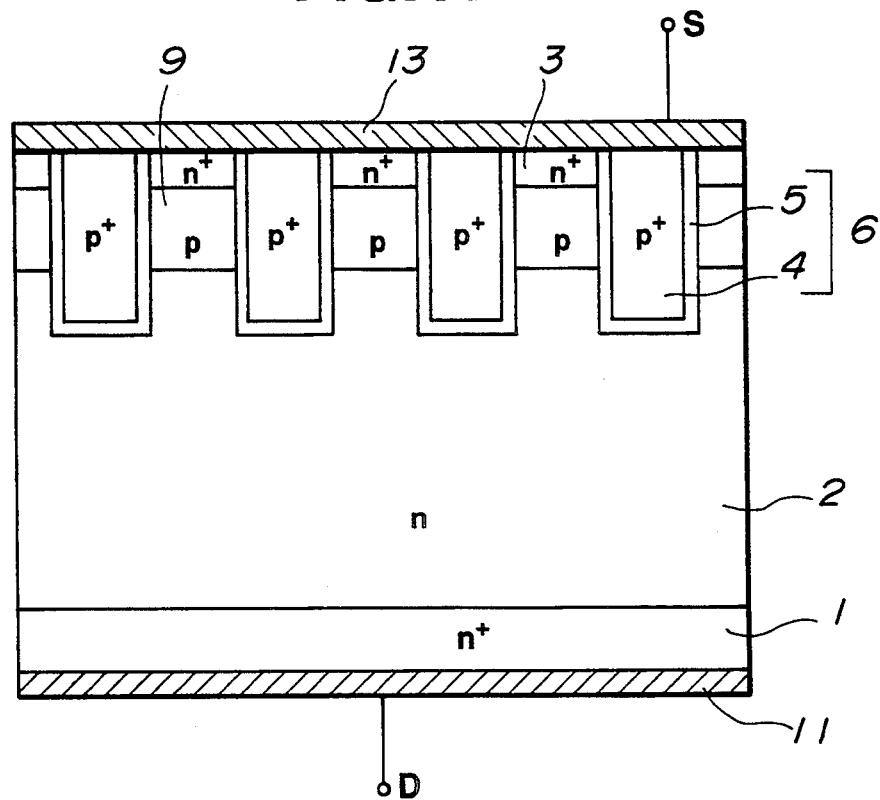
FIG. 17 is a cross sectional view of a structure of a semiconductor device in a second preferred embodiment according to the present invention.

FIG. 17 shows the device in the second preferred embodiment according to the present invention. In this embodiment, there is additionally a p type region in the channel region 7 which corresponds to a "base" region of bipolar transistors.

The impurity density of the p type region 9 may considerably be thinner than that of the base of BJTs, that is, for example, $1 \times 10^{16}$ cm$^{-3}$.

No matter how thin the impurity density of the p type region 9 is, the off-state of the device against a high drain electric field can be maintained because that is sandwiched by the potential-fixed insulated electrodes as shown in FIG. 17. And the p type region 9 may or may not connect with the p type injector region 8. Anyway the carriers (holes) can move between both p type regions through the path on the surfaces of the insulating films 5. And being the same as in the case of the first embodiment, the advantage of high $h_{FS}$ can also be achieved in this second embodiment. In this structure, the high conductivity accumulation layer of the holes is formed at the interface between the insulating film 5 and the p type region 9, that functions as an efficient path of the holes coming through the injector electrode 18.

That is to say, the potential-fixed insulated electrode 6 virtually corresponds to a "base electrode" of general bipolar transistors and it is very close to the "emitter" region (the source region of this device). Consequently, a high $h_{FS}$ can be expected.

Figure 18:
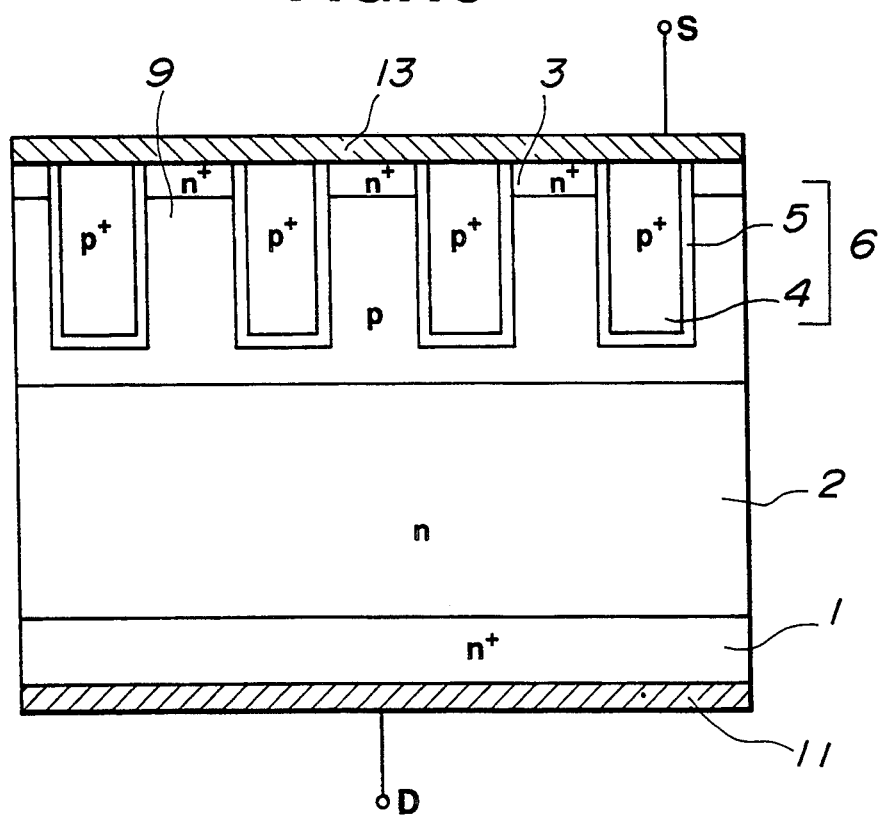
FIG. 18 is a cross sectional view of a modification of the second preferred embodiment shown in FIG. 17.

By the way, the fact that the bottom of the potential-fixed insulated electrode 6 touches the n type drain region is not essential. So the p type region 9 may cover the whole surface of the potential-fixed insulated electrode as shown in FIG. 18. But in this case, the "base length" becomes longer than the case of FIG. 17, so the electric characteristics of that device may be affected.

The Peripheral Structure of the Device

Next, what about the peripheral structures of the device according to the present invention will be explained below.

Generally, at such bottom corners of the potential-fixed insulated electrodes as shown in FIG. 9, the electric field may concentrate thereon even if they are actually manufactured to be round. And this phenomenon may reduce the breakdown voltage of the device. But in the device according to the present invention, since the potential-fixed insulated electrodes 6 adjoin mutually with a very small spatial interval, that is, the channel thickness H, the electric fields are divided at the corners being adjoin mutually. So the concentration of the electric fields may become negligible. But when the cells as shown in FIGS. 9 and 10 are arranged on the surface of a chip, it is not avoidable to exist the potential-fixed insulated electrodes which has no partner to divie the electric field thereof at the edge of the active region.

Figure 32:
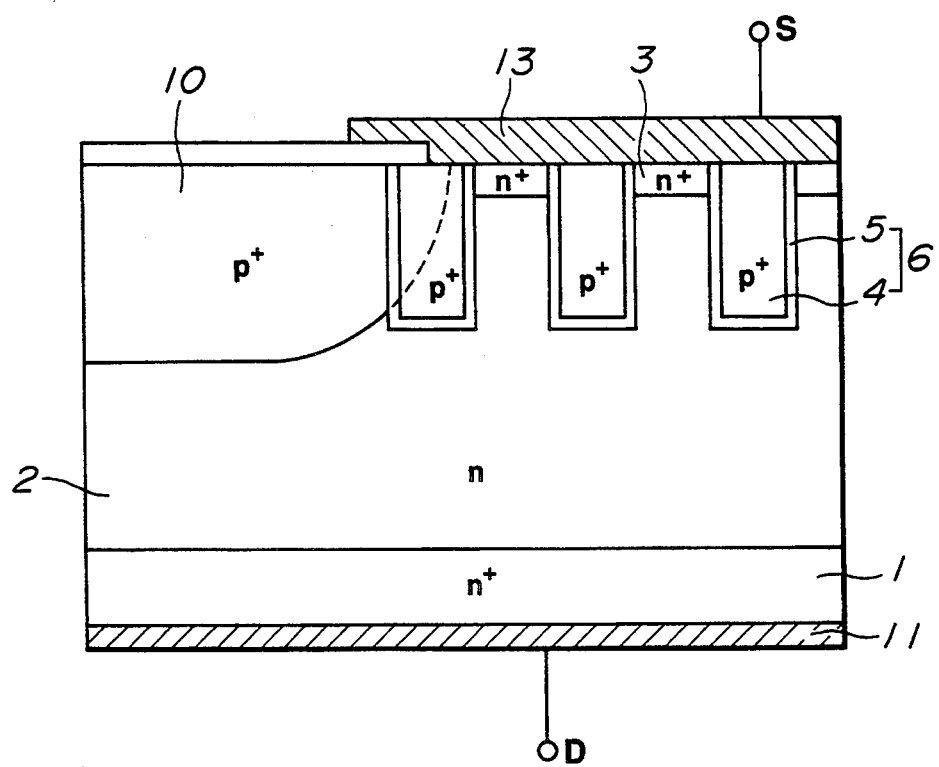
FIG. 32 is a cross sectional view of an example of a peripheral structure of the semiconductor device according to the present invention.

Generally, to avoid the concentration of the electric field therein, a p type region 10 which provides a curved junction having a large radius of curvature is installed thereat as shown in FIG. 32. This p type region 10 may be connected with the injector electrode as is the same as a p type injector region 8, as shown in FIG. 10. And, for instance, this p type region 10 corresponds to a first guard ring of the device.

Figure 33:
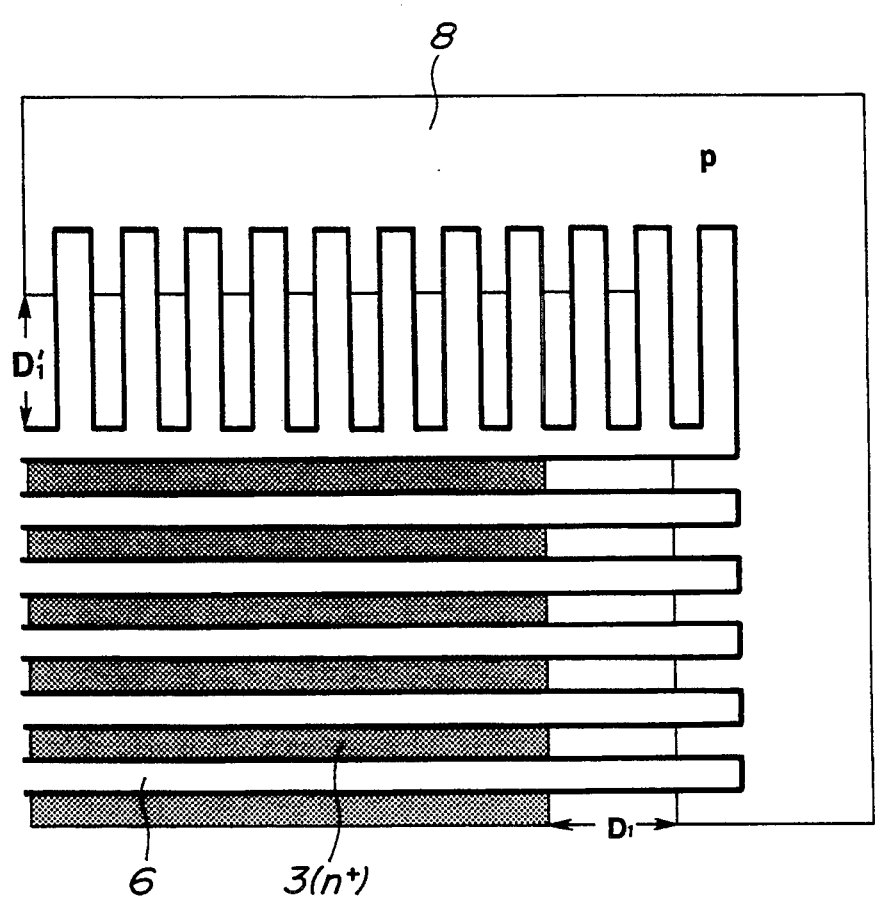
FIG. 33 is a cross sectional view of another example of the peripheral structure of the semiconductor device according to the present invention.

However, such countermeasure is not suitable for the device according to the present invention. This is because, at the on-state of the device, the hole density in the channel region being near to the p type region 10 becomes higher than that in other channel regions, which brings the non-uniformity of the conductivity, and that of the current density. So it will be better to use for this problem such a pattern as shown in FIG. 33. FIG. 33 shows a surface view of the peripheral region of the device being done a suitable countermeasure. In this figure, the p type region 8 is the injector region which is the same as in FIG. 10 and the insulating film 5 is omitted in this illustration for better understanding. There are many sub-branches at the side of the most outside of the potential-fixed insulated electrode, which are arranged in strips in the same way as the normal cells.

Every end of the sub-branch exists in the p type region 8 being the same as the end of normal potential-fixed insulated electrode as shown in FIG. 10. In such structure, there is no bottom corner of the potential-fixed insulated electrode having no partner to divide the electric field. The length "D" in FIG. 33 is the distance between an n+ type source region 3 and a p type injector region 8, and length "D'" is the distance between the beginning of the sub-branch and the p type region 8.

It is noted that all of the explanations above are based on the fact that the impurity type of the semiconductor substrate is n type, but it is also preferable that the impurity types of all semiconductor regions are reverse.

Effects Achieved by the Present Invention

Next, the differences in function and structure between the device according to the present invention and first, second, and third reference devices described in the BACKGROUND OF THE INVENTION will be summarized below.

Figure 1:
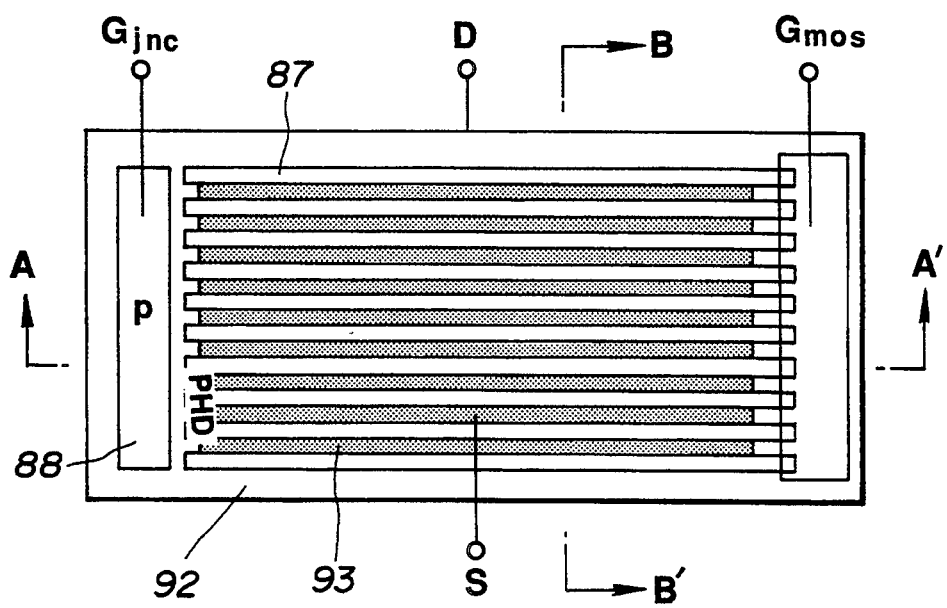
FIGS. 1 through 3 are top view and cross sectional views of the first reference device described in the BACKGROUND OF THE INVENTION.
Figure 2:
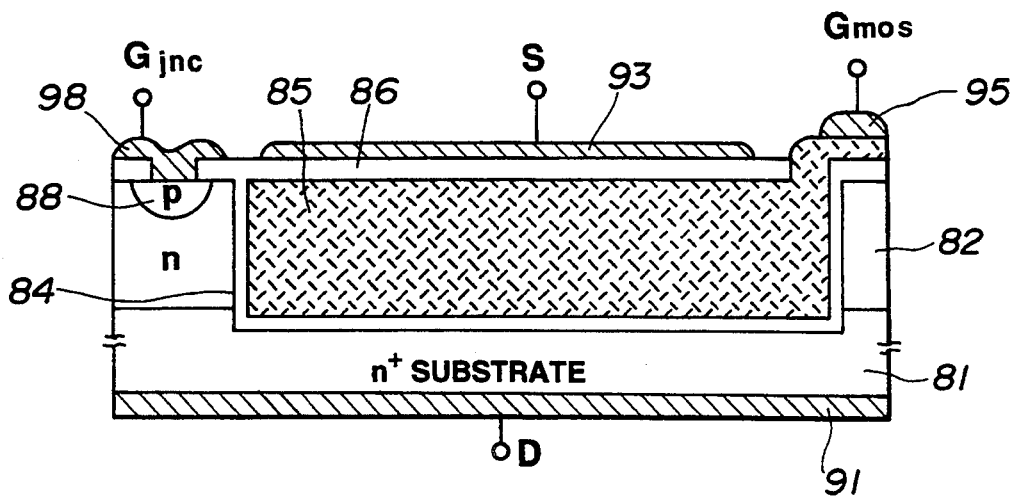
Figure 3:
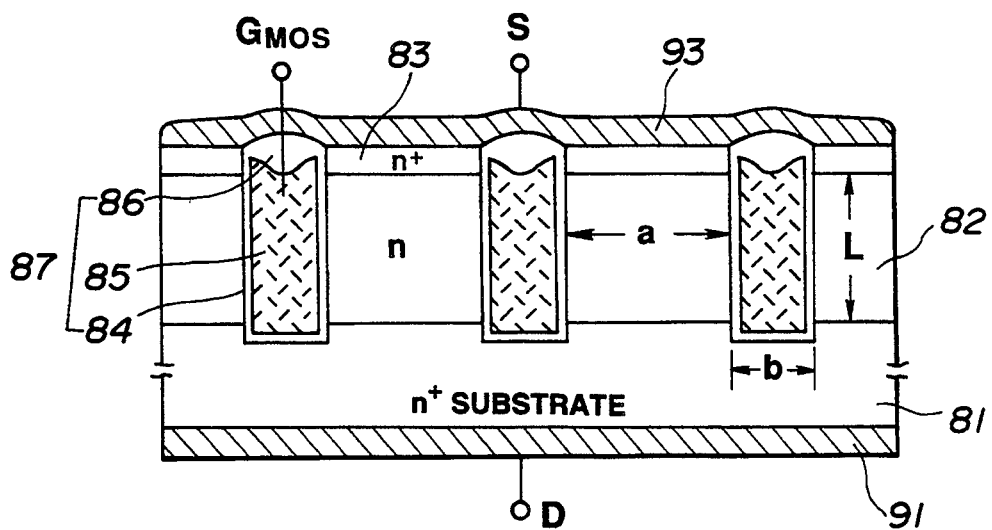
Figure 4:
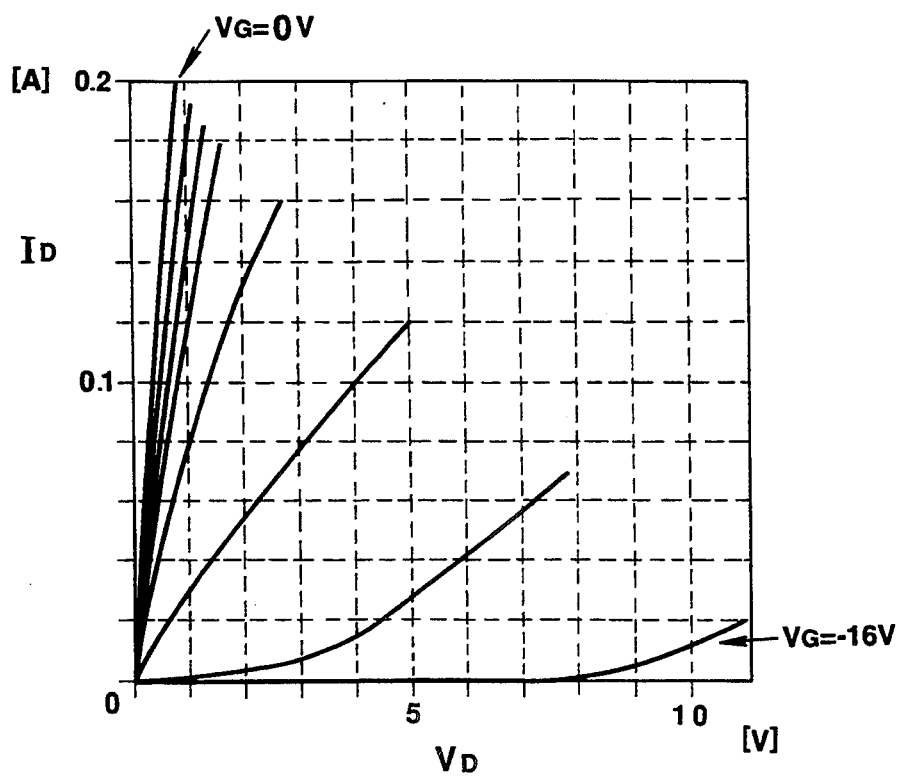
FIGS. 4 and 5 are characteristic curves of current versus voltage in the case of the first reference device shown in FIGS. 1 through 3.
Figure 5:
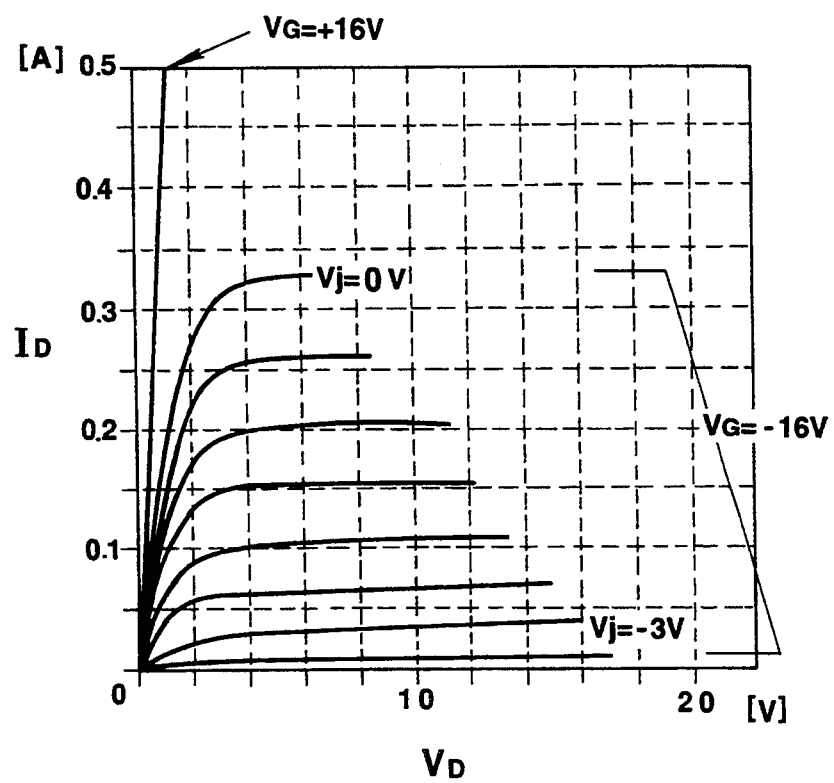

First, the differences between the present invention and the first reference device shown in FIGS. 1 through 3 will be described below.

In the first reference device, a potential at the insulating electrode (MOS type gate 95) is variable and the insulating electrode 84 potential is positive so that the accumulation layer of electrons is formed on the interface to the insulating film 84. Thus, a low channel resistance can be achieved and the insulating electrode 87 is used as the control electrode.

On the other hand, according to the present invention, since the insulated electrode (potential-fixed insulated electrode(s) 6) is fixed to the source potential. Therefore, the potential-fixed insulated electrode 6 is basically not the "control electrode". This is an essential difference from that in the first reference device shown in FIGS. 1 through 3.

In addition, in the first reference device, the semiconductor device is the normally-on type. To interrupt the main current, a negative potential needs to positively be supplied to the junction gate 98 and MOS gate 95.

However, according to the present invention, the semiconductor device is essentially of the normally-off type. Hence, to maintain the off-state, the electrode 18 for the injection control may be set to the same potential as the source region 3, i.e., ground potential.

In the present invention, it is essential point that the injector electrode 8 contacts with the insulating film 5. Thereby, the potential of the insulating film's surface is controlled by means of the applying potential to the injector electrode 18. On the other hand, in the first reference device, the junction gate 98 has no contribution to the on-state of the device. That because, as far as the quoted paper, the p type region 88 does not contact with the insulating film 84. So, even if the potential of the junction gate 98 is set to a positive potential, the condition of the insulating film's surface cannot be affected thereby.

Furthermore, according to the present invention, the on-state of the semiconductor device is achieved by supplying the minority carriers from the injector region(s) 8 to open the channel so that the conductivities of both drain region and channel region are modulated.

On the other hand, in the device of the first reference, even if a positive potential is applied to the junction gate 98 to inject the minority carriers to the channel region, it cannot give any influence on the channel region 98, which has a high impurity density to conduct a monopolar current at a low resistance. The phenomena of modulating (or increasing) the conductivity of a semiconductor region by a high level injection of its minority carriers will be explained below. The injected minority carriers act as extra impurity ions thereof, so that the conductivity of the semiconductor region increases temporaly. This phenomena is remarkable in a low impurity density semiconductor region. That is, for instance, the drain region of the first preferred embodiment device of the present invention. Its impurity density is designed about $10^{14}$ cm$^{-3}$ to withstand a high voltage. So the "conductivity modulation" phenomena is remarkable and the main current can flow at low resistance in the drain region which as originally a low conductivity. But, in a forward biased p-n diode or a similar structure, the density of the highly injected minority carriers will be at most an order of $10^{16}$ cm$^{-3}$. And in case of the first reference device, the impurity density is designed to conduct a monopolar current at low resistance. Because this value is comparable to the maximum density of the exceed minority carriers in logarithmic scale, this phenomena is negligible in there. In this way, while the first reference device is a monopolar device, the device according to the present invention is the bipolar device. It is clear that both devices are largely different from each other.

Figure 6:
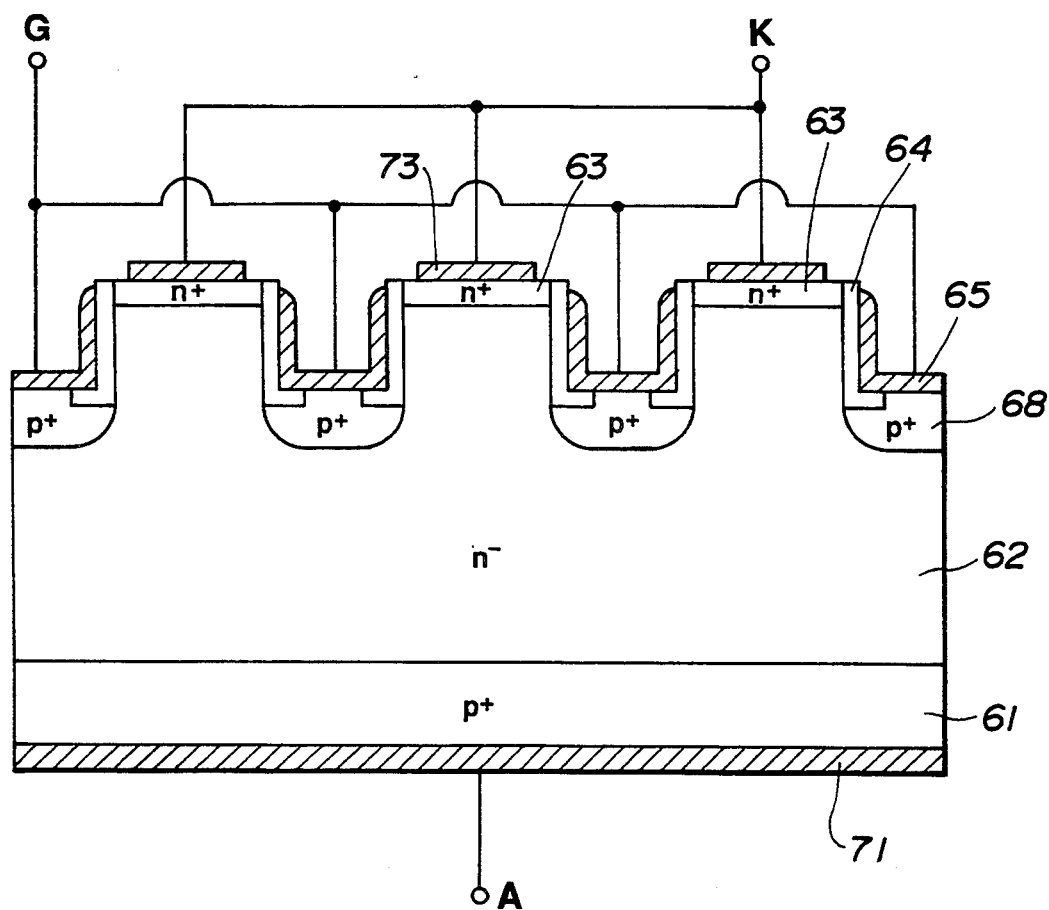
FIG. 6 is a cross sectional view of the second reference described in the BACKGROUND OF THE INVENTION.

Next, the differences between the second reference device shown in FIG. 6 and that according to the present invention will be described below.

In the second reference device, the p type region (p+ gate region 68) which serves as the control electrode is exist under the bottom part of the trench in which the insulated electrode (gate electrode 65) exist, and it has an ohmic contact with the insulated electrode at the bottom of the trench. And as the same as the first reference device, the point that the insulated electrode of the second reference device is the control electrode is essentially difference from the device of the present invention. And the position of the p type region is different. And the fact that at the second reference device, the potential of the p type region is interlocked with the insulated electrode is a different point. Furthermore, the mechanism to achieve a low on-resistance is apparently different. In the second reference device, the minority carriers to modulate the conductivity of the n− type base region 62 is injected from the p+ type anode region 61. Since the p+ type anode region is the substrate of the device and is a part of the main current path, the main current consists of both electrons and holes. On the other hand, in the device of the present invention, the minority carriers to modulate the conductivity of the n− type drain region is injected from the p type region 8 which exist on the surface of the drain region and is not a part of the main current path. So the element that consists of the main current is almost electrons.

Figure 7:
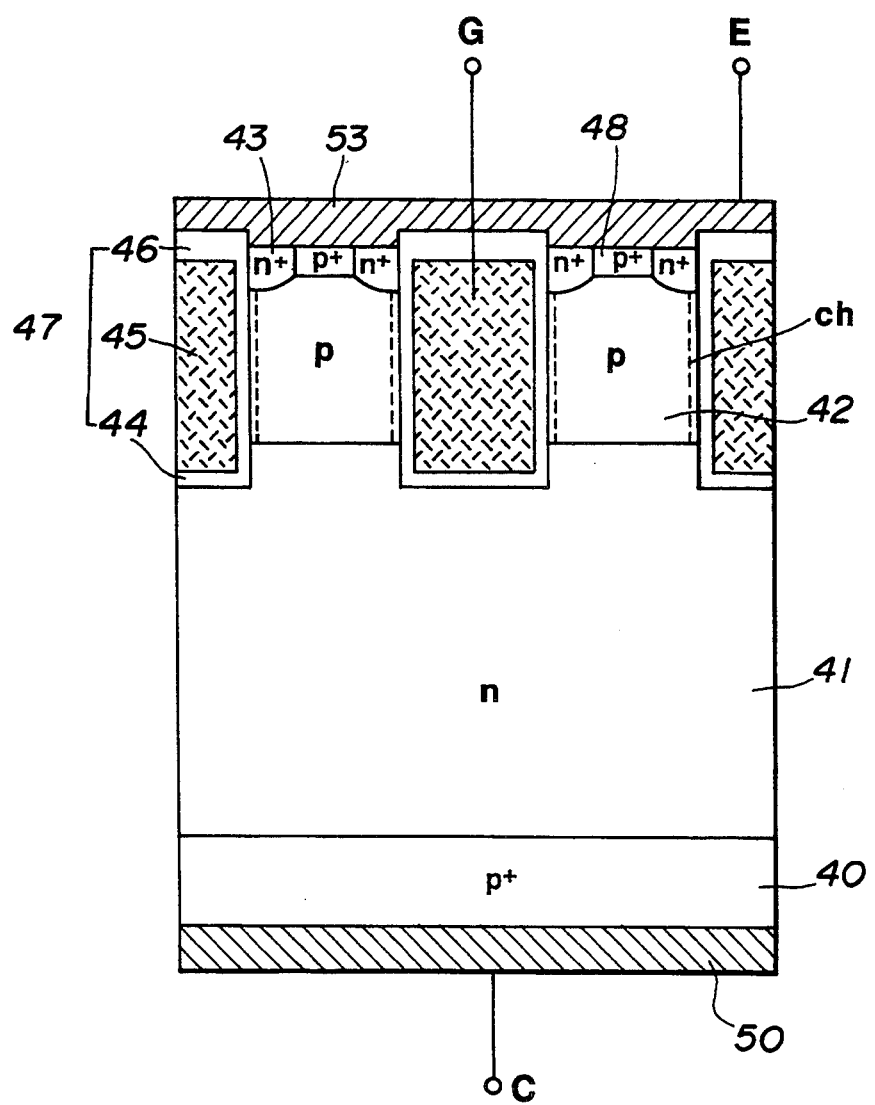
FIG. 7 is a cross sectional view of the third reference described in the BACKGROUND OF THE INVENTION.

Next, differences between the third reference device shown in FIG. 7 and the structure of the device according to the present invention will be described below.

The device structure of the third reference, at a glance, resembles the second embodiment of the present invention. However, in the device of the third reference device, the potential of the insulated gate (gate electrode 45) is variable and is the control electrode and the potential of the p type region (the base region) is fixed initially. On the contrary, in the device according to the present invention, the potential of the p type region (the injector region 8) is variable and the potential of the insulated electrode (the potential-fixed insulated electrode 6) is fixed. These are the obvious differences on constitutions. Furthermore, in the third reference device, the main current path in the channel region is the inversion layer on the interface between the channel region and the insulating film. But, in the device according to the present invention, the current path in the channel region is the center line portion or the whole of the channel region.

In addition, the methods of the conductivity modulation of a high-resistivity region are different between in the present invention and the second or third reference device. As described above, in the second and third reference devices, a p-n junction is provided in the main current path, so that a sufficient current value cannot be achieved when the voltage between the main electrodes is under 0.7 V. On the contrary, in the case of the present invention, there is no p-n junction in the main current path, so that the main current can flow sufficiently even at the low voltage.

The advantages of the device according to the present invention are summarized below:

(1) normally-off characteristic;
(2) the current-control type three-terminal device;
(3) having a low on-resistance;
(4) capable of controlling a large main current by a less control current;
(5) suitable structure for the pattern minimization;
(6) suitable structure for a high breakdown voltage design;
(7) having no parasitic device;
(8) can be manufactured by the conventional LSI manufacturing technologies.

It will fully be appreciated by those skilled in the art that the forgoing description is made in terms of the preferred embodiments and various changes and modifications may be made without departing from the scope of the present invention which is to be defined by the appended claims.

What is claimed is:

1. A structure of a semiconductor device, comprising:
   a) a semiconductor substrate having one conductivity type, which constitutes a drain region;
   b) at least one trench dug from a surface of said substrate;
   c) at least one source region having the same conductivity type as said drain region, which is formed on a main surface of said substrate, and which is so constructed as to be provided adjacent to said trench;
   d) at least one potential-fixed insulated electrode whose potential is fixed to the potential of said source region, and which includes an insulating film covering a whole inner surface of the trench and a conductive material having a work function so as to form a depletion region in said drain region near said insulating film;
   e) a channel region which is a part of said drain region, which is adjoined below said source region, and which is so constructed as to be provided adjacent to said trench; and
   f) at least one injector region having an opposite conductivity type to said drain region, formed on said drain region and which contacts with said insulating film of said potential-fixed insulated electrode, but does not contact with said source region, and wherein, during an off-state of said semiconductor device which is maintained by setting a potential of said injector region which is the same as that of said source region, a potential barrier against the majority carriers constituted by said depletion region is formed so that said source region is disconnected with a neutral region of said drain region electrically, and during an on-state of said semiconductor device, which is realized by applying a predetermined potential to said injector region, the minority carriers are introduced into an interface between said insulating film and said drain region with which said injector region contacts, and said minority carriers form an inversion layer which shields an electric field from said potential-fixed insulated electrode to said channel region to reduce a height of said potential barrier, thus said source region connects with said drain region electrically, and wherein, the conductivity of said drain region is increased by the minority carrier injection from said injector region to said drain region.

2. A structure of a semiconductor device as set forth in claim 1, wherein both side walls of said trench are approximately vertical with respect to said main surface of said drain region, wherein a channel length being defined as a distance between said source region and a bottom surface of said trench is at least twice or more than a channel thickness being defined as a distance between said insulating films facing mutually in said channel region.

3. A structure of a semiconductor device as set forth in claim 1, wherein some of said trenches are joined to unit.

4. A structure of a semiconductor device as set forth in claim 1, further comprising an opposite conductivity type base region inserted between said source region and said channel region.

5. A structure of a semiconductor device as set forth in claim 4, said base region is so constructed as to contact with said injector region.

6. A structure of a semiconductor device as set forth in claim 4, wherein said base region is so constructed as to contact with said injector region.

7. A structure of a semiconductor device as set forth in claim 1, wherein the junction formed between said injector region and said drain region is present up to a point which is deeper than said bottom surface of said trenches.

8. A structure of a semiconductor device as set forth in claim 1, the conductivity type of said drain region is p type and that of said injector region is n type.

9. A structure of a semiconductor device as set forth in claim 1, wherein the conductivity type of said drain region is p type and that of said injector region is n type.

10. A structure of a semiconductor device as set forth in claim 1, wherein the impurity concentration of said drain is less than $1 \times 10^{14} cm^{-3}$, said channel thickness is approximately 2 $\mu$m, said thickness of said insulating film is more than 50 nm.

11. A structure of a semiconductor device as set forth in claim 10, wherein said channel length is approximately 6 $\mu$m.

12. A structure of a semiconductor device as set forth in claim 1, wherein a top view of said each trench is approximately a bar shape, and said source region contacts with said insulating film at a center portion of said bar shape trench, and said injector region contacts with said insulating film at an edge portion of said bar shape trench.

13. A structure of a semiconductor device as set forth in claim 1, wherein a top view of said each trench is approximately a C-shape, and said source region contacts with said insulating film at an inner portion of C-shape, and said injector region contacts with said insulating film at toe edges of said C-shape.

14. A structure of a semiconductor device, comprising:
   a) an n type semiconductor substrate having a drain region;
   b) at least one trench dug from a main surface of said substrate;
   c) at least one source region, being an n type which is the same as that of the drain region, which is formed on the main surface of said substrate, and which is so constructed as to be adjacent to said trench;
   d) at least one potential-fixed insulated electrode whose potential is fixed to a potential of said source region, and which includes an insulating film covering a whole inner surface of the trench and a conductive material having a work function so as to form a depletion region in said drain region near said insulating film;
   e) at least one channel region which is a part of said drain region, which is adjoined to and below said source region, and which is so constructed as to be adjacent to said trench; and
   f) a p type injector region formed on said drain region and said insulating film of each of said potential-fixed insulated electrode, but not in contact with said source region,
   and wherein, during an off-state of said semiconductor device which is maintained by setting a potential of said injector region which is the same as that of said source region, a potential barrier against the majority carriers constituted by said depletion region is formed so that said source region is disconnected from a neutral region of said drain region electrically, and
   during an on-state of said semiconductor device, which is realized by applying a predetermined positive potential to said injector region, holes are introduced into an interface between said insulating film and said drain region with which said injector region contacts, and the holes form an inversion layer which shields an electric field from said potential-fixed insulated electrode to said channel region to reduce a height of said potential barrier, thus said source region contact with said drain electrically, and
   furthermore, the conductivity of said drain region is increased by the hole injection from said injector region to said drain region.

15. A structure of a semiconductor device as set forth in claim 14, wherein said conductive material of said potential-fixed insulated electrode is p type polycrystalline semiconductor.

16. A structure of a semiconductor device as set forth in claim 14, wherein said conductive material of said potential-fixed insulated electrode is any metal.

17. A structure of a semiconductor device as set forth in claim 14, wherein both side walls of said each trench are approximately vertical to said main surface of said drain region, a channel length which is defined as a distance between said source region and a bottom surface of said trench is at least twice or more a channel thickness which is defined as a distance between said insulating films facing mutually in said channel region.

18. A structure of a semiconductor device as set forth in claim 14, further comprising a p type base region inserted at each interface of said source regions and said channel regions.

19. A structure of a semiconductor device as set forth in claim 15, wherein said base regions are so constructed as to contact with said injector region.

20. A structure of a semiconductor device as set forth in claim 15, wherein said base regions are so constructed as to enclose said potential-fixed insulated electrode, and are adjoined each other.

21. A structure of a semiconductor device as set forth in claim 14, wherein a junction formed between said p type injector region and said n type drain region is present up to the point which is deeper than said bottom surface of said trenches.

22. A structure of a semiconductor device, comprising:
   a) a semiconductor substrate having one conductivity type, which constitutes a drain region;
   b) at least one trench dug from a main surface of said substrate;
   c) at least one source region having the same conductivity type as said drain region, which is formed on the main surface of said substrate, and which is so constructed as to be provided adjacent to said trench;

d) at least one potential-fixed insulated electrode whose potential is fixed to a potential of said source region, and which includes an insulating film covering a whole inner surface of the trench and a conductive material having a work function so as to form a depletion region in said drain region near said insulating film;

e) a channel region which is a part of said drain region, which is provided below said source region, and which is so constructed as to be provided adjacent to said trench; and f) at least one injector region having an opposite conductivity type, formed on said drain region and which contacts with said insulating film of said potential-fixed insulated electrode, but does not contact with said source region.

* * * * *